US007906964B2

(12) United States Patent
Fleysher et al.

(10) Patent No.: US 7,906,964 B2
(45) Date of Patent: Mar. 15, 2011

(54) METHOD AND SYSTEM FOR DETERMINING ACQUISITION PARAMETERS ASSOCIATED WITH MAGNETIC RESONANCE IMAGING FOR A PARTICULAR MEASUREMENT TIME

(75) Inventors: Lazar Fleysher, Brooklyn, NY (US); Roman Fleysher, Stamford, CT (US); Oded Gonen, Leonardo, NJ (US)

(73) Assignee: New York University, New York, NY (US)

( * ) Notice: Subject to any disclaimer, the term of this patent is extended or adjusted under 35 U.S.C. 154(b) by 383 days.

(21) Appl. No.: 12/021,632

(22) Filed: Jan. 29, 2008

(65) Prior Publication Data
US 2008/0197841 A1 Aug. 21, 2008

Related U.S. Application Data

(60) Provisional application No. 60/887,099, filed on Jan. 29, 2007.

(51) Int. Cl.
*G01V 3/00* (2006.01)
(52) U.S. Cl. ........................................ 324/309; 324/307
(58) Field of Classification Search .................. 324/309, 324/307
See application file for complete search history.

(56) References Cited

U.S. PATENT DOCUMENTS

| | | | | |
|---|---|---|---|---|
| 5,410,250 A | * | 4/1995 | Brown | 324/309 |
| 5,657,757 A | * | 8/1997 | Hurd et al. | 600/413 |
| 6,687,527 B1 | * | 2/2004 | Wu et al. | 600/410 |
| 7,570,051 B2 | * | 8/2009 | Haider | 324/307 |

OTHER PUBLICATIONS

Da Xing et al., "Optimised Diffusion-Weighting for Measurement of Apparent Diffusion Coefficient (ADC) in Human Brain", Magnetic Resonance Imaging, 1997, vol. 15, No. 7 pp. 771-784.
Sean C.L. Deoni et al., "Rapid Combined $T_1$ and $T_2$ Mapping Using Gradient Recalled Acquisition in the Steady State", Magnetic Resonance Imaging, 2003, vol. 49, pp. 515-526.
Henry Z. Wang et al. "Optimizing the Precision in $T_1$ Relaxation Estimation Using Limited Flip Angles", Magnetic Resonance Imaging, 1987, vol. 5, pp. 399-416.
Fleysher, Lazar et al., "Optimizing the Precision-per-unit-time of quantitative MR metrics: Examples for T1, T2 and DTI," Magnetic Resonance in Medincine 57 (2007) pp. 380-387.
Haacke et al., "Magnetic Resonance Imaging: Physical and Sequence Design," Chapter 22, pp. 664-665 John Wiley & Sons, 1999.

* cited by examiner

*Primary Examiner* — Louis M Arana
(74) *Attorney, Agent, or Firm* — Dorsey & Whitney LLP

(57) ABSTRACT

An exemplary embodiment of system, computer-accessible medium and method for determining exemplary values for acquisition parameters for a given time (e.g., imaging time) is provided, e.g., with the exemplary values being selectable to increase the signal-to-noise ratio. According to certain exemplary embodiments of the present disclosure, data (e.g., image data) associated with at least one portion of a target can be generated. For example, a first signal from the target resulting from at least one first excitation pulse forwarded toward the target can be acquired using a plurality of acquisition parameters having first values. Further, a second signal from the target resulting from at least one second excitation pulse forwarded toward the target can be acquired using a plurality of acquisition parameters having second values, with the second values being different from the first values. The data (e.g., image data) may be generated based on the first and second signals.

23 Claims, 12 Drawing Sheets

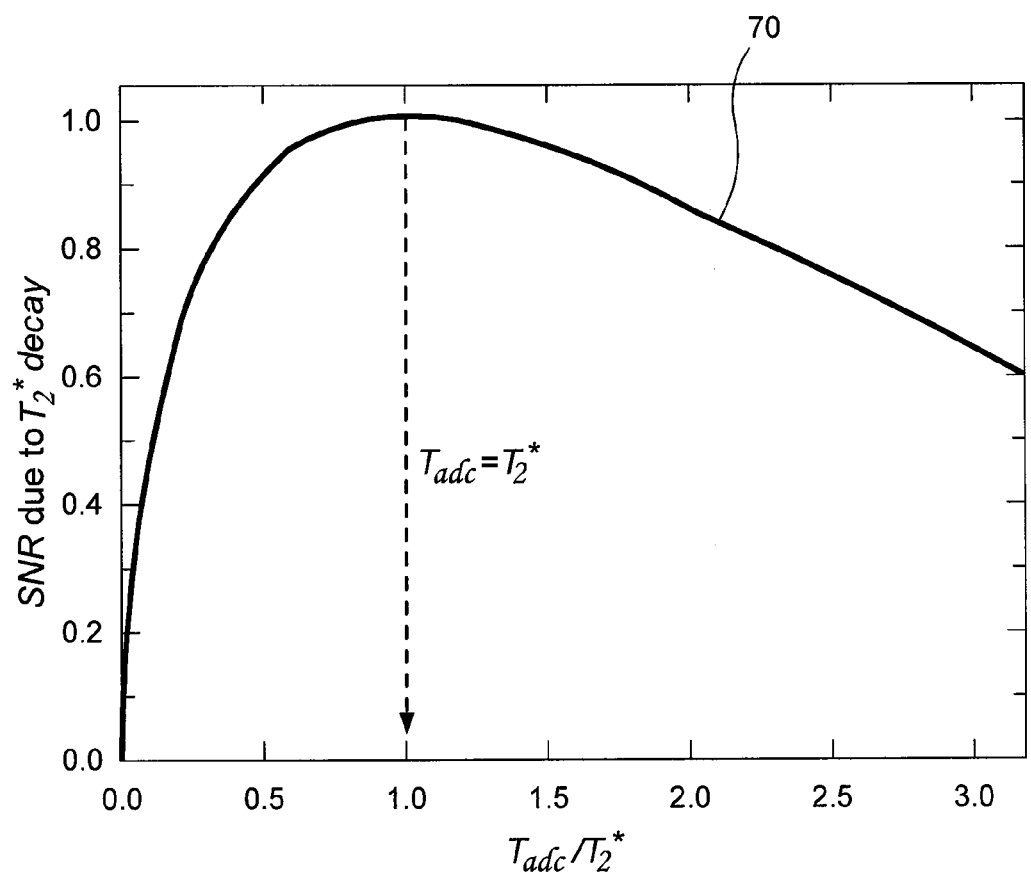
F I G. 2

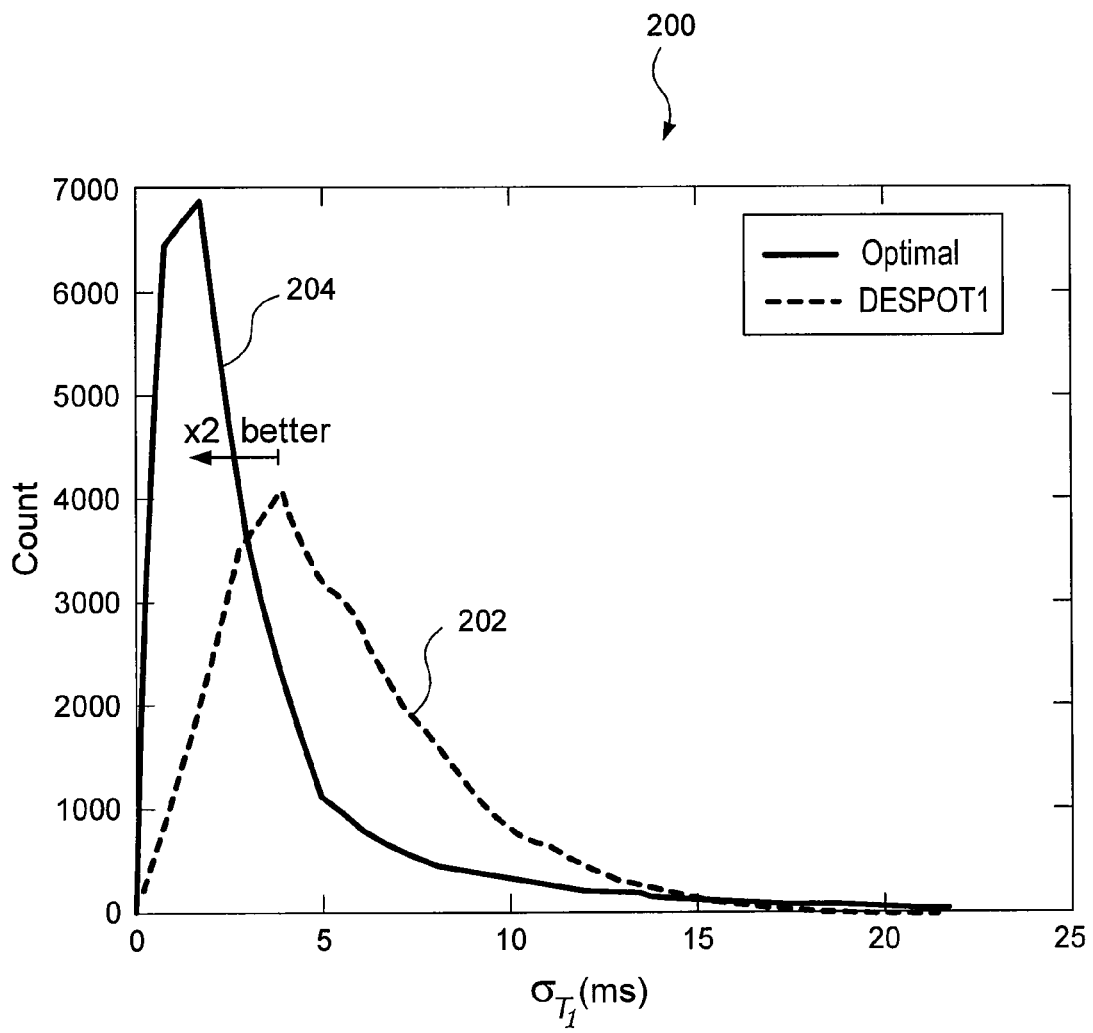
F I G. 5

METHOD AND SYSTEM FOR DETERMINING ACQUISITION PARAMETERS ASSOCIATED WITH MAGNETIC RESONANCE IMAGING FOR A PARTICULAR MEASUREMENT TIME

CROSS-REFERENCE TO RELATED APPLICATIONS

This application claims the benefit of priority from U.S. patent application Ser. No. 60/887,099, filed Jan. 29, 2007, the entire disclosure of which is incorporated herein by reference.

FIELD OF THE INVENTION

The present invention relates generally to magnetic resonance imaging. In particular, exemplary embodiments of the present invention relate to systems and methods for setting values for image acquisition parameters that can be based on a predetermined or user-defined criteria (e.g., the amount of time available to acquire the data).

INTRODUCTION

Magnetic resonance imaging ("MRI") has emerged as a leading medical imaging technology for the detection and assessment of many pathological and physiological alterations in living tissue, including many types of tumors, injuries, brain-related conditions, coronary conditions, and orthopedic conditions, among others. One of the main advantages of MRI is that, according to current medical knowledge, an MRI scan of a patient is non-invasive and harmless to such patient. Other advantages of MRI techniques may include a high spatial resolution, superior anatomical imaging detail of soft tissues as compared to other medical imaging technologies, and an ability to acquire images in any plane.

An MRI scan generally utilizes magnetic and radio frequency ("RF") fields to elicit a response from a given patient's tissue and to provide high quality image "slices," i.e., two-dimensional image reconstructions of a two-dimensional cross-section of the patient's body, e.g., a tissue along with detailed metabolic and anatomical information. Radio waves are generally transmitted through the patient's body. The pulse used to transmit waves through the patient's body may be referred to as the excitation pulse. This affects the patient's atoms by forcing the nuclei of some atoms into an excited state. As such nuclei return into their ground state, they transmit their own radio waves. An MRI scanner picks up or acquires those radio waves, and a computer transforms these waves into images, e.g., based on the location and strength of the incoming magnetic waves. Typically, the MRI apparatus is configured to some acquisition parameter and then data are acquired.

MRI generally uses T1 relaxation time and T2 relaxation time, both tissue-specific time constants for protons, to distinguish between tissue types. The T1 relaxation time (also referred to as spin lattice or longitudinal relaxation time) and the T2 relaxation time (also referred to as spin relaxation time or transverse relaxation time) are biological parameters used in MRIs to distinguish between tissue types. The T1 relaxation time is a measure of the time taken to realign with the external magnetic field. The T1 constant may indicate how quickly the spinning nuclei will emit their absorbed RF into the surrounding tissue. The T2 relaxation time is dependent on the exchanging of energy with nearby nuclei. T2 is the decay of the magnetization perpendicular to the main magnetic field (in an ideal homogenous field).

Every tissue in the human body has its own T1 and T2 value. The term T1 weighted can be used to indicate an image where most of the contrast between tissues is due to differences in the T1 value. T2 weighted imaging generally relies upon local dephasing of spins followed by the application of the transverse energy pulse.

The high sensitivity of clinical ($T_1$ and $T_2$-weighted) MRI to morphology, endogenous contrast changes, or extraneous contrast changes has led to this procedure's diagnostic prominence. However, MRI currently does not have commensurate specificity to underlying pathologies. To address this lack of specificity, quantitative MR techniques such as magnetization-transfer-ratio, diffusion weighted imaging (DWI), or diffusion tensor imaging (DTI) may be used. DTI is a modified form of DWI which facilitates the determination of directionality as well as the magnitude of water diffusion. Further, $T_1$ and $T_2$ maps may be added to the MRI protocol. Frequently, these metrics can be derived from two repetitions of the MRI acquisitions, which also may be referred to herein as the "two-point method". The two-point method may be conducted with some of the acquisition sequence parameters changed between the first and second images. Typically, in a two-point experiment, a single sequence parameter can be changed, and otherwise identical acquisition-pair may be repeated until all measurement time is spent.

Signal-to-noise ratio ("SNR" or "S/N") is used to describe the relative contributions to a detected signal of the true signal and random superimposed signals ("background noise")—a criterion for image quality. Generally, MR images have an intrinsically low SNR that generally leads to a variability in the quantitative metrics derived from the images, thus likely limiting the usefulness of the images. Increasing SNR can improve the precision of metrics derived from images from the MRI. One common method to increase the SNR is to average several measurements of the signal, on the expectation that random contributions will tend to cancel out. This method can be useful in MRI experiments that are relatively short. While averaging can increase SNR, improvement accrues slowly, in proportion to the square root of the imaging time. Studies have been done seeking to optimize measurement strategies. These studies generally share several limitations: their acquisition parameters e.g. the number of averages, repetition times, or flip angles, are frequently restricted in one way or another; the effects of signal decay during readout are typically ignored; and the restriction of total imaging time is not taken into account.

It is generally understood that the high image SNRs needed to obtain reliable quantitative MR metrics generally increase measurement time and/or require specialized hardware. While time is at a premium for any in vivo MRI, in clinical settings, the slow pace of SNR improvement can preclude a meaningful prolonging of any protocol. Further, hardware upgrades are often too expensive for research and exclusionary for clinical applications. These can include, for example, parallel imaging, higher fields, stronger faster gradients, lower noise components, or better coils. Consequently, "free" precision gains from software and protocol design strategies are generally the practical alternatives.

The current most efficient strategy for obtaining $T_1$ maps within clinically acceptable time is based on acquiring two spoiled gradient recalled echo (SPGR) images in steady states with variable flip angles. Although the method's efficiency can be maximized by introducing various repetition times and number of averages used to acquires each image in the pair, its fundamental premise remains: The actual values of the flip angles experienced by the spins are necessary for accurate $T_1$ calculation. Fortunately, at 1.5 Tesla the imprecise knowledge of these angles caused by a combination of radio-frequency (RF) pulse imperfections, transmit coil profiles, standing wave effects, etc. results only in insignificant bias in $T_1$. At higher field strengths, however, the transmit RF inhomogeneity ($B_1$) becomes progressively worse. It leads to systematic errors in $T_1$ that can no longer be neglected, preventing direct migration of the two-point method to 3 T and above.

In order to take advantage of the increased sensitivity offered by high field scanners adiabatic pulses that deliver uniform excitation can be employed. Specific absorption rate (SAR) limits, however, especially at high fields, may lower the efficiency or even preclude this approach. In general, given a particular hardware setup, the only way to cope with the SAR limit is to decrease or re-design the flip angles and/or increase the time intervals between them, rendering the SAR a sequence design restriction. An alternative approach to mitigate the $B_1$ inhomogeneity is to map it in situ using a separate $B_1$ measuring sequence. Unfortunately, it is time consuming and possibly SAR prohibitive in itself. In addition, $B_1$ measurement uncertainty propagates into the error of $T_1$ estimate, further reducing the overall efficiency of the scheme. Other solutions offered in the literature employ different sequences, requiring various RF power levels, imaging time and post processing needs. Ultimately, regardless of the approach, the quality of $T_1$ estimation is given by its measurement error $\sigma_{T_1}$ achieved in a given experimental time which includes the duration of calibration scans (if any).

Accordingly, it may be beneficial to provide exemplary embodiments of systems and methods for increasing SNR in the metric of interest that accrues faster than in proportion to the square-root of the total imaging time.

SUMMARY OF EXEMPLARY EMBODIMENTS

To address at least some of the deficiencies described above, exemplary embodiments of systems and methods for MRI for setting values for image acquisition parameters that are based on a predetermined or user-defined criteria (e.g., the amount of time available to acquire the image) can be provided. The exemplary embodiments may be used with any multi-point acquisition technique including, for example, two-point and three-point acquisition techniques.

In view of the foregoing, one of the objects of the present invention is to provide exemplary embodiments of a system and method to determine exemplary values for acquisition parameters based on a given imaging time.

It is another object of the present invention is to increase signal-to-noise ratio during MRI by determining exemplary values based on a given imaging time, in which the signal-to-noise ratio in the metric of interest is increased at a rate faster than the square-root of time.

In accordance with one exemplary embodiment, method, system and computer accessible medium can be provided for generating data associated with at least one portion of a target. For example, at least one first excitation pulse can be forwarded toward the target. A first signal from the target resulting from the at least one first excitation pulse may be acquired using a plurality of acquisition parameters having first values. Further, at least one second excitation pulse can be forwarded toward the target. A second signal from the target resulting from the at least one second excitation pulse may be acquired using a plurality of acquisition parameters having second values, with the second values being different from the first values. The data may be generated based on the first and second signals.

The exemplary embodiment of the computer accessible medium can have, stored thereon, computer executable instructions for generating an image of at least a portion of a target which when executed by a processing arrangement configure the processing arrangement to perform the procedure described above.

In accordance with yet another exemplary embodiment, method, system and computer accessible medium can be provided for determining values for acquisition parameters for magnetic resonance techniques. For example, a type of pulse sequence can be selected to generate data, unknown physical quantities may be identified, and acquisition parameters for the pulse sequence can be identified. A relationship may be determined between the data acquisition parameters and the unknown physical quantities. Further, at least one restriction may be defined. A cost function can then be defined using the determined relationship, the cost function being a function of the acquisition parameters, and the unknown physical quantities. Values may then be determined for the acquisition parameters by minimizing the cost function and taking into account the at least one restriction. Alternatively, no restriction may be identified and the cost function may be minimized without taking into account such restriction.

In accordance with a further exemplary embodiment, method, system and computer accessible medium can be provided for generating data using a magnetic resonance technique. For example, a train of pulses may be applied to a target. The train of pulses may be a first excitation pulse having a first flip-angle and a second excitation pulse having a second flip-angle. The second excitation pulse can be applied at a time after the first excitation pulse sufficiently short that longitudinal recovery between applying the first excitation pulse and the second excitation pulse is neglected. A signal resulting from the excitation pulses may be acquired and the data is generated based on the acquired signal.

These and other objects, features and advantages of the present invention will become apparent upon reading the following detailed description of embodiments of the invention, when taken in conjunction with the appended claims.

BRIEF DESCRIPTION OF THE DRAWINGS

Further objects, features and advantages of the invention will become apparent from the following detailed description taken in conjunction with the accompanying figures showing illustrative embodiments of the invention, in which:

FIG. 2 is an exemplary graph illustrating SNR as a function of $T_{adc}$ (in units of $T_2^*$) with a maximum at $T_{adc}=T_2^*$, in accordance with one exemplary embodiment;

FIG. 5 is an exemplary histogram of the distribution of experimental variability in $T_1$, $\sigma_{T_1}$, estimates using DESPOT1 (dashed curve) and the a two-point $T_1$ method (solid curve) in accordance with one embodiment;

FIG. 10a is a greyscale in vivo map of T1 in accordance with one exemplary embodiment;

FIG. 10b is a histogram of T1 values of FIG. 10a;

FIG. 10c is a greyscale in vivo map of B1 in accordance with one exemplary embodiment; and FIG. 10d is greyscale receive-coil-profile corrected $T_2$*-weighted spin density image in accordance with one exemplary embodiment.

Figure 1A:
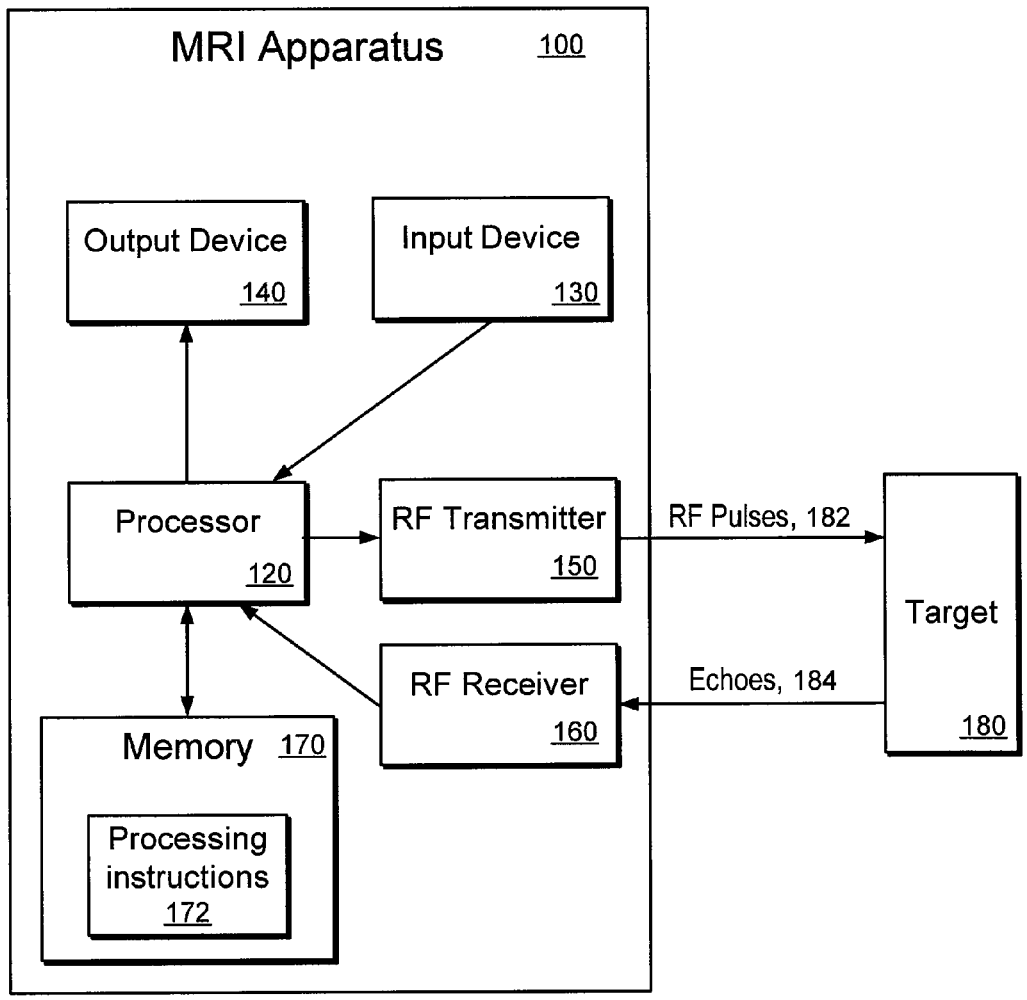
FIG. 1a is a diagram of an exemplary embodiment of a system according to the present invention.

Throughout the figures, the same reference numerals and characters, unless otherwise stated, are used to denote like features, elements, components, or portions of the illustrated embodiments. Moreover, while the present invention will now be described in detail with reference to the figures, it is done so in connection with the illustrative embodiments.

DETAILED DESCRIPTION OF EXEMPLARY EMBODIMENTS

In accordance with certain exemplary embodiments of the present invention, systems and methods for determining exemplary values for acquisition parameters for a given imaging time, with the exemplary values being chosen to increase the signal-to-noise ratio in a metric of interest, can be provided. Acquisition parameters having the exemplary values may be used for the given imaging time to image a physical quantity of interest. According to certain exemplary embodiments, such imaging can thus be optimized. Given a quantitative description of the desired goal and the total imaging time available, an exemplary MR-scanner system can thus be configured to achieve the stated goal using the system and method. It is to be appreciated that systems and methods according to exemplary embodiments herein may alternatively be used in nuclear magnetic resonance (NMR) procedures.

FIG. 1a shows an exemplary embodiment of an MRI apparatus 100 according to the present invention which may be used to implement or specifically configured/programmed to perform the method 10 described below with respect to FIGS. 1b and 1c.

As shown in FIG. 1a, a series of radio frequency ("RF") pulses 182 can be transmitted by an RF transmitter 150 of the MRI apparatus 100 toward a target 180. The series of RF pulses 182 can generate echoes 184 from the target 180, which may be received by an RF receiver 160 of the NRI apparatus 100. In one exemplary embodiment, a single device, e.g., a transceiver, can be used as both an RF receiver 160 and an RF transmitter 150. The received echoes 184 (also referred to as acquired signal) may be processed by the processor 120 of the MRI apparatus 100 using instructions 172 which, e.g., may be stored in memory 170. The data may be stored by the MRI apparatus 100, for example, also in memory 170. The processor 120 can generate an image of the target 180 to be displayed, for example, on an output device 140. The exemplary embodiment of the MRI apparatus 100 of FIG. 1a may also include an output device 140, such as a display, a printer for displaying, and/or printing the resulting image of the target 180. The exemplary MRI apparatus 100 of FIG. 1a can further include an input device 130, for example, for sending instructions to the processor 120 to cause processor 120 to transmit the RF pulses 182, so as to process the data received from the echoes 184, and display the resulting image of the target 180.

A set of acquired exemplary images $\rho_i$ (i=0, 1, ..., N−1) of an N-point method can depend on the acquisition parameters (such as, e.g., repetition times, flip angles, echo times, receiver bandwidths, number of averages, etc.), collectively labeled as $\lambda$ and a physical property of interest $\tau$ as:

$$\rho_i = \rho_i(\lambda|\tau), i=0, 1, \ldots, N-1 \tag{Eq. 1}$$

Using the exemplary embodiments of the system and method according to the present invention, an acquisition strategy $\overline{\lambda}$ may be established that leads to a generally precise estimate of $\tau$.

As can be appreciated, the acquired images (of equation 1) are likely subject to random noise. Thus, using error propagation rules, an estimate of experimental error $\sigma(\tau|\lambda)$ on $\tau$ for a selected acquisition strategy $\lambda$ can be obtained. An efficient acquisition strategy can be such that for a given total imaging time $T_{total}$ provides the smallest error.

$$\sigma(\tau | T_{total}) = \sigma(\tau | \overline{\lambda}) = \min_{T_{total}} \sigma(\tau | \lambda) \tag{Eq. 2}$$

Such acquisition strategy can be obtained by searching for the minimum of $\sigma(\tau|\lambda)$ analytically and/or numerically. Execution of this exemplary strategy generally leads to a precise estimate of the value of $\tau$ in the specified total imaging time $T_{total}$. If the value of the error function $\sigma(\tau|T_{total})$ is known before the acquisition, such value may be used in planning of the measurements, e.g., without any "field tests".

The exemplary embodiment of the system and method according to the present invention may be used with any suitable MR imaging acquisition technique or, optionally, with NMR techniques or spectroscopy techniques. For example, the exemplary method may be used for $T_1$ imaging using two gradient-echo (GRE) acquisitions, $T_2$ imaging using two spin-echo acquisitions, $T_2$* imaging using two GRE acquisitions, apparent diffusion coefficient imaging using two diffusion-weighted acquisitions, $T_1$ imaging insensitive to $B_1$ inhomogeneities using three GRE acquisitions, $B_1$ imaging insensitive to $T_1$ using three GRE acquisitions, a fast $B_1$ mapping imaging sequence (described below), or other sequences. The exemplary embodiment of the method can use expressions for all acquisition parameters of a given sequence. This can lead, based on error propagation rules, to a generally minimal variability (optimal precision) in the sought metric achievable per a given imaging time.

Figure 1B:
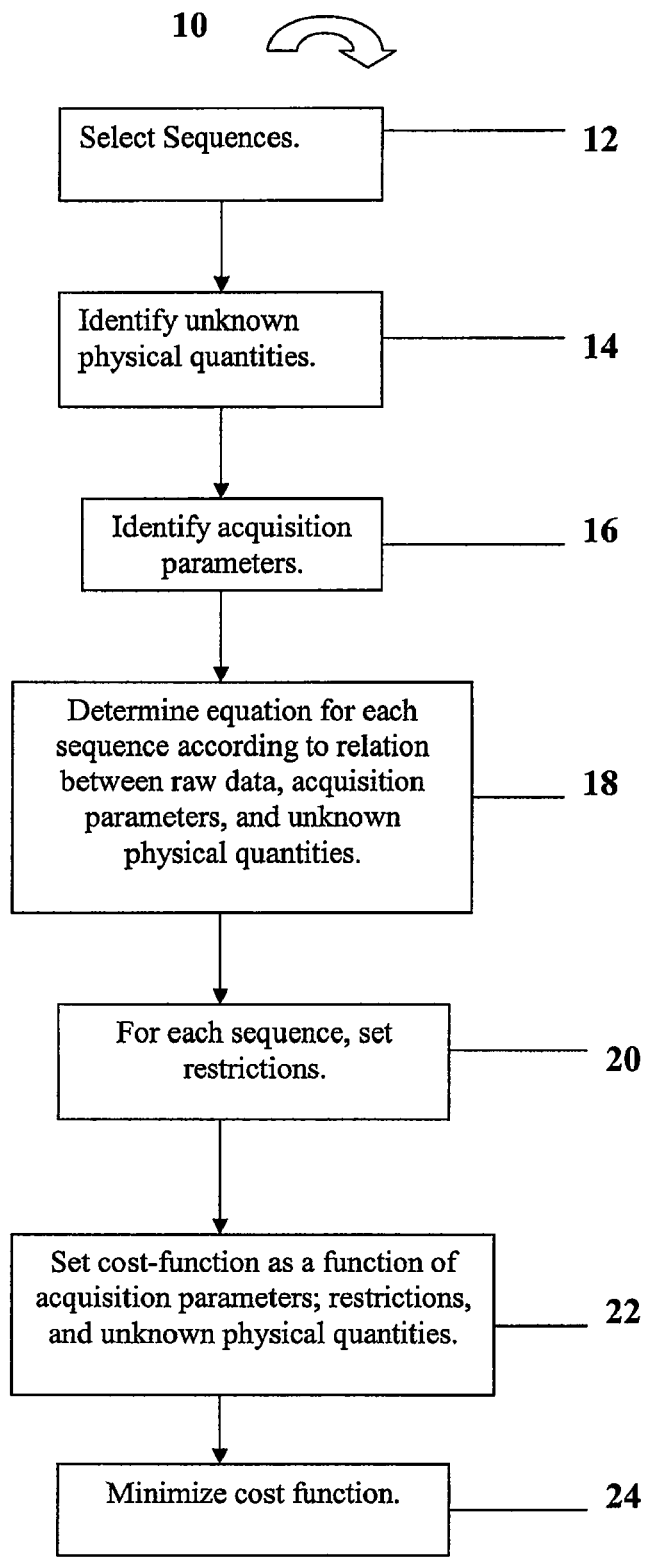
FIG. 1b is an exemplary flow diagram of an exemplary embodiment of a method according to the present invention.
Figure 1C:
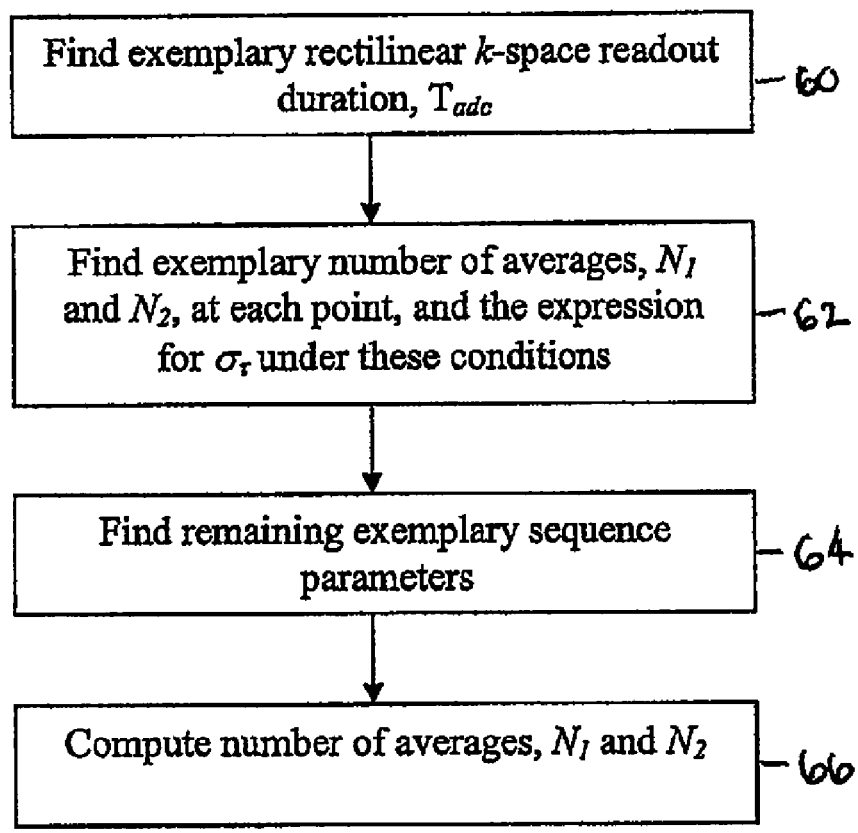
FIG. 1c is an exemplary flow diagram of an exemplary embodiment of a further method according to the present invention.

FIG. 1b illustrates a flow diagram of one exemplary embodiment of a method 10 for determining exemplary values for acquisition parameters for a given imaging time. As shown in FIG. 1b, a set of sequences sensitive to a physical quantity of interest can be selected [block 12]. The physical quantity of interest may be, for example, T1, T2, diffusion coefficient, B1-profile, filtration rate, etc. Unknown physical quantities can be identified [block 14]. Acquisition parameters for the sequences are identified [block 16]. The acquisition parameters of the sequences may be, for example, repetition time, echo time, flip angle, number of averages, diffusion weighting, contrast agent dose, receiver bandwidth, etc.

After unknown physical quantities and acquisition parameters are identified, an equation may be determined for each sequence according to, e.g., the relation between the raw acquired data, acquisition parameters, and unknown physical quantities [block 18]. For each sequence, any existing restrictions, including total imaging time, can be set [block 20]. Restrictions may include, in addition to total imaging time, hardware limitations, power deposition restrictions, contrast agent doze restrictions, and/or others. Using the equations of block 18, a cost-function can be set as a function of the acquisition parameters, restrictions, and unknown physical quantities [block 22]. The cost-function of block 22 may be set as a function of the acquisition parameters, restrictions, and unknown physical quantities [block 24]. The value of the cost-function may be minimized over the acquisition parameters using assumed a priori values of the unknown physical quantities taking into account any restrictions if necessary. Using this method, the values for the acquisition parameters can be determined to establish an efficient acquisition strategy. The acquisition parameters may be set and used to acquire data [block 25].

Using the exemplary method shown in FIG. 1b and described herein, a set of acquisition sequences sensitive to a physical quantity of interest may be specified by the user, and exemplary values for the acquisition parameters may be determined wherein the acquisition sequences depend on the physical quantity of interest, thereby establishing an efficient acquisition strategy. The acquisition parameters (which can also be referred to as configuration parameters of the sequence or sequence parameters) may be selected by the operator. Values for the sequence settings that yield the preferable quality in estimation of the parameter of interest may be determined by minimizing the cost function of block 22. Generally, time may be considered as one of the important resources that can be consumed to increase quality of the resultant images. Especially in clinical scenarios, it may not be possible to continually increase time, although the resultant SNR can be higher. Using the exemplary method shown in FIG. 1b, exemplary values for acquisition parameters may be determined for images that result in a session protocol having a preset total imaging time. The values may be determined taking into account hardware limitations, power deposition restrictions, contrast agent doze restriction, and/or other limitations or restrictions.

Thus, while current two-point method techniques may change a single acquisition parameter, the exemplary embodiment of the method according to the present invention described can adjust a plurality, for example all, of the acquisition parameters and the number of averages at each point according to its contribution to the sought metric's precision. This exemplary method can increase the precision of the two-point T1, T2 and diffusion coefficients estimation by approximately 13-90% for the same sample, sequence, hardware, and duration when compared with other methods. Further, using the exemplary method, precision generally may accrue faster than the square-root of time. In further exemplary embodiments, the system and method may be used for any multi-point acquisition, for example a three-point acquisition.

According to a further exemplary embodiment of the present invention, for a three-point acquisition, comprises a method based on three SPGR echo sequences for $T_1$ quantification can be provided that is insensitive to flip angle inhomogeneities. Despite the complication caused by flip angle non-uniformity, this exemplary method can attain a precision of $T_1$ estimation comparable to that achieved by other two-SPGR methods in the same time and spatial resolution and exceeds them in accuracy. If the two-SPGR methods are combined with $B_1$ measurement for accuracy, then the exemplary three-SPGR method may supersede them in precision.

Using the exemplary system and method according to the present invention described, it is possible to increase the rate at which the precision of the quantitative MR metrics extracted from these images accrues by performing two or more acquisitions and varying more than one parameter between the acquisitions. Furthermore, with the sequence, e.g., instrument, and sample, total imaging time alone may be used to specify the optimal acquisition protocol. As for data analysis, if the metric may not be found analytically, fast numeric solution is possible using tabulation and interpolation.

The exemplary generalized optimization framework described herein can be applied to any problem that can be cast into the form of Eqs. [1].

Exemplary Two-Point $T_1$, $T_2$ Method

MR Image intensity, $\rho$, is generally related to its set of acquisition parameters, $\lambda$, spin density, $\rho_0$, and an unknown value of the physical property of interest, $\tau$, as:

$$\rho = \rho_0 f(\lambda | \tau) \qquad [\text{Eq. 3}]$$

Because $\rho$ depends on two unknowns, at least two acquisitions with different $\lambda$s can be used to estimate $\tau$. Generally, both acquisitions may share identical bandwidth, readout, field-of-view (FOV), and spatial resolution to ensure identical reconstruction artifacts. To improve the estimation precision, each image in the pair can, time permitting, be averaged any number of times to improve its SNR. After two images, $\rho_1$ and $\rho_2$, are acquired with different parameters, $\lambda_1$ and $\lambda_2$, the value of the metric of interest $\tau$ may be extracted by solving $\rho_1/\rho_2 = f(\lambda_1/\tau)/f(\lambda_2/\tau)$. The exemplary protocol optimization procedure described herein can provide high precision results per the given imaging time. As available time is increased, the precision increases faster than in proportion to the square root of imaging time.

To illustrate that the precision of $\tau$ can increase faster than the square root of imaging time, T, the expression for its variability, $\sigma_\tau$, can be derived as a function of the acquisition parameters and $\sigma_\tau$ is minimized with respect to $\lambda$ subject to a fixed T. This may be done in three exemplary steps as also shown in FIG. 1c. The exemplary rectilinear k-space readout duration, $T_{adc}$ is found from its relationship with $T_2^*$ [block 60]. The exemplary number of averages, $N_1$ and $N_2$, at each point, and the expression for $\sigma_\tau$ under these conditions as a function of the remaining sequence parameters, are found [block 62]. The remaining exemplary sequence parameters are found numerically given the transcendental equations obtained for them have no analytic solutions [block 64]. The number of averages, $N_1$ and $N_2$, may be computed subsequently [block 66].

Provided below is a detailed description of these exemplary steps.

Optimal Readout Duration—$T_{adc}$ [block 60]

During acquisition, the MR signal generally suffers $T_2^*$ decay, and its average intensity is proportional to its value in the middle of the readout $e^{-T_{adc}/2T_2^*}$. While this tempts to make the readout as short as possible, noise in the images likely changes in proportion to $1/\sqrt{T_{adc}}$, and the SNR is given by:

$$SNR \propto \sqrt{T_{adc}} e^{-T_{adc}/2T_2^*} \qquad [\text{Eq. 4}]$$

An improved SNR, therefore, may be achieved at $T_{adc}=T_2^*$, as shown in the graph of FIG. 2. Specifically, FIG. 2 illustrates an exemplary graph 70 of SNR as a function of $T_{adc}$ (in units of $T_2^*$). As shown in this figure, the maximum of SNR is provided at $T_{adc}=T_2^*$. If $T_{adc}=T_2^*$ cannot be met due to some constraint, $T_{adc}$ may be made as close as possible to this exemplary optimum.

Measurement Variability [Block 62]

Given two images, $\rho_1$, $\rho_2$, acquired with different parameters, $\lambda_1$, $\lambda_2$, from Eq. [3], a set of equations on $\tau$ and $\rho_0$: may be obtained:

$$\begin{cases} \rho_1 = \rho_0 f(\lambda_1 | \tau) \\ \rho_2 = \rho_0 f(\lambda_2 | \tau) \end{cases} \qquad [\text{Eq. 5}]$$

Solution of this set can provide the best estimate of $\tau$ and $\rho_0$. Error propagation arguments show that the variance, $\sigma_\tau^2$, is related to the variances $\sigma_1^2$ and $\sigma_2^2$ in the two averaged images by:

$$\sigma_\tau^2 = \left(\frac{\partial \tau}{\partial \rho_1}\right)^2 \sigma_1^2 + \left(\frac{\partial \tau}{\partial \rho_2}\right)^2 \sigma_2^2 \qquad [\text{Eq. 6}]$$

If $\sigma_0$ is the standard deviation of the (random) noise in individual image, determined by a common sample, bandwidth, FOV, resolution and receiver hardware, then, due to averaging, the standard deviation can be $\sigma_{1,2} = \sigma_0/\sqrt{N_{1,2}}$. Therefore, $$\sigma_\tau^2 = \sigma_0^2 \left[\frac{1}{N_1}\left(\frac{\partial \tau}{\partial \rho_1}\right)^2 + \frac{1}{N_2}\left(\frac{\partial \tau}{\partial \rho_2}\right)^2\right], \qquad [\text{Eq. 7}]$$

is the expression to be minimized subject to the total imaging time constraint:

$$T = N_1 T_{R,1} + N_2 T_{R,2}, \qquad [\text{Eq. 8}]$$

where $T_{R,1}$ and $T_{R,2}$ are the repetition times of each experiment in the pair.

Optimization [Block 64]

Although a search for the acquisition parameters that minimize $\sigma_\tau$, Eq. [7], is a multi-dimensional non-linear problem, the optimization with respect to $N_1$ and $N_2$ can be performed analytically. Under the constraint of Eq. [8], it is equivalent to the minimization of:

$$\zeta = \frac{1}{N_1}\left(\frac{\partial \tau}{\partial \rho_1}\right)^2 + \frac{1}{N_2}\left(\frac{\partial \tau}{\partial \rho_2}\right)^2 + \theta \cdot (N_1 T_{R,1} + N_2 T_{R,2} - T) \qquad [\text{Eq. 9}]$$

where $\theta$ is the Lagrange multiplier. Setting its derivatives in $N_1$, $N_2$ and $\theta$, to zero, results in:

$$\left.\frac{N_1}{N_2}\right|_{opt} = \sqrt{\frac{T_{R,1}}{T_{R,2}}} \frac{|(\partial \tau/\partial \rho_2)|}{|(\partial \tau/\partial \rho_1)|} \qquad [\text{Eq. 10}]$$

and $$\left.\sigma_\tau\right|_{opt} = \frac{\sigma_0}{\sqrt{T}} \left[\left|\frac{\partial \tau}{\partial \rho_1}\right|\sqrt{T_{R,1}} + \left|\frac{\partial \tau}{\partial \rho_2}\right|\sqrt{T_{R,2}}\right]. \qquad [\text{Eq. 11}]$$

The derivatives' explicit form can be available as follows. For example, after dividing the first Eq. [5] by the second, it is possible to obtain an equation in $\tau$.

$$\Psi(\tau(\rho_1,\rho_2),\rho_1,\rho_2) \equiv \rho_1 f(\lambda_2|\tau) - \rho_2 f(\lambda_1|\tau) = 0 \qquad [\text{Eq. 12}]$$

The explicit expression for the derivative ($\partial \tau/\partial \rho_{1,2}$), therefore, can be obtained by defining a new function $g(\lambda|\tau)$, $$g(\lambda|\tau) = \frac{\partial f(\lambda|\tau)}{\partial \tau} \qquad [\text{Eq. 13}]$$

and by differentiating Eq. [12]:

$$\frac{\partial \tau}{\partial \rho_{1,2}} = -\frac{\partial \Psi}{\partial \rho_{1,2}} \bigg/ \frac{\partial \Psi}{\partial \tau} \qquad [\text{Eq. 14}]$$

$$= -\frac{f(\lambda_{2,1}|\tau)}{\rho_0 [f(\lambda_1|\tau) g(\lambda_2|\tau) - f(\lambda_2|\tau) g(\lambda_1|\tau)]}$$

Inserting the derivatives' explicit form, Eqs. [13] and [14] into Eqs. [10] and [11], utilizing Eq. [4] and minimizing with respect to the remaining acquisition parameters, can yield:

$$\left.\frac{N_2}{N_1}\right|_{opt} = \frac{f(\lambda_1|\tau)}{f(\lambda_2|\tau)} \sqrt{\frac{T_{R,1}}{T_{R,2}}} \qquad [\text{Eq. 15}]$$

$$\left.\sigma_\tau\right|_{opt} = \frac{\sigma_0}{\rho_0 \sqrt{T}} \qquad [\text{Eq. 16}]$$

$$\min_{\lambda_1,\lambda_2} \frac{1}{\sqrt{T_{adc}} e^{-T_{adc}/2T_2^*}} \left|\frac{f(\lambda_1|\tau)\sqrt{T_{R,2}} + f(\lambda_2|\tau)\sqrt{T_{R,1}}}{f(\lambda_1|\tau) g(\lambda_2|\tau) - f(\lambda_2|\tau) g(\lambda_1|\tau)}\right|$$

The explicit dependence of $\sigma_\tau$ on $\sqrt{T}$ may thus be provided automatically. Because the rest of the expression is minimized with respect to the sequence parameters $\lambda_1$, $\lambda_2$ when T is increased, the optimization can either find the same minimum or a new, lower, one which was not attainable at shorter T, and can approach the global minimum. Therefore, e.g., when all sequence parameters are allowed to be varied, $\sigma_\tau$ decreases not-slower than $\propto 1/\sqrt{T}$. The exemplary minimization may reveal the existence of multiple sets of acquisition parameters yielding the same (optimal) precision per given T. Such protocols, however, are equivalent with regard to their efficiency and the choice among them, therefore, can be made based on other criteria.

The structure of Eq. [16] comprises three factors. The first, $\sigma_0/\rho_0\sqrt{T}$, describes the hardware, the second, $1/(\sqrt{T_{adc}} e^{-T_{adc}/2T_2^*})$ accounts for the noise contribution due to the imaging readout and the third, $$\left|\frac{f(\lambda_1 \mid \tau)\sqrt{T_{R,2}} + f(\lambda_2 \mid \tau)\sqrt{T_{R,1}}}{f(\lambda_1 \mid \tau)g(\lambda_2 \mid \tau) - f(\lambda_2 \mid \tau)g(\lambda_1 \mid \tau)}\right|,$$

reflects the sensitivity of the sequence to the metric of interest.

Although precision of different exemplary acquisition strategies can be compared via their $\sigma_\tau$, Eq. [16], it may be beneficial to introduce a dimensionless normalized coefficient of variation, $\epsilon_\tau$:

$$\varepsilon_\tau = \frac{\sigma_\tau \mid_{opt}}{\tau} \cdot \frac{\rho_0 \sqrt{T}}{\sigma_0} \sqrt{T_2^*}\, e^{-1/2} \max_{\lambda_0} f(\lambda_0 \mid \tau), \quad \text{[Eq. 17]}$$

where the term $$\frac{\rho_0 \sqrt{T}}{\sigma_0} \sqrt{T_2^*}\, e^{-1/2} \max_{\lambda_0} f(\lambda_0 \mid \tau)$$

is the maximal SNR in the raw image, Eq. [3], achievable in a total imaging time T, and is characteristic of the sequence, sample and hardware. Then, a sample- and hardware-independent measure of the precision of the exemplary embodiment of the method can be given by:

$$\varepsilon_\tau = \frac{1}{\tau} \max_{\lambda_0} f(\lambda_0 \mid \tau) \cdot \min_{\lambda_1, \lambda_2} \frac{\sqrt{T_2^*}\, e^{-1/2}}{\sqrt{T_{adc}}\, e^{-T_{adc}/2T_2^*}} \quad \text{[Eq. 18]}$$

$$\left|\frac{f(\lambda_1 \mid \tau)\sqrt{T_{R,2}} + f(\lambda_2 \mid \tau)\sqrt{T_{R,1}}}{f(\lambda_1 \mid \tau)g(\lambda_2 \mid \tau) - f(\lambda_2 \mid \tau)g(\lambda_1 \mid \tau)}\right|,$$

where smaller $\epsilon_\tau$ indicates more efficient use of imaging time.

Generally, the sequence parameters minimizing $\epsilon_\tau$ in Eq. [18] may not be found analytically. Consequently, this can be done, e.g., numerically and $N_1$, $N_2$ may be calculated subsequently using Eqs. [15] and [8].

Nonunique to the optimization considered, the values of the optimal sequence parameters may depend on the assumed magnitude of the metric of interest, $\tau$. In practical situations, knowledge of the approximate value of $\tau$ can often be available, and may be used for the optimization. Once an acquisition protocol is fixed, the precision at any value of $\tau$ can be assessed using Eqs. [7]. Continuity of the error function, Eq. [7], may establish an interval of $\tau$ around its assumed value where the optimal protocol outperforms any other one.

Exemplary Three Point Method

A further exemplary embodiment according to the present invention provides a three-SPGR method. For the exemplary method for $T_1$ estimation to be used in clinical settings, the field of view (FOV), spatial resolution and total allocated examination time (T) can be considered as exogenous variables determined by the experimenter. The remaining SPGR sequence parameters, nominal flip angle ($\alpha$), repetition time (TR), number of averages of a scan (N), echo time (TE) and readout duration ($T_{adc}$), may be optimized for the quality in the resultant $T_1$ maps regardless of the unknown spatial flip angle non-uniformity. The observed SPGR intensity (S) in each pixel is a function of the sequence parameters, longitudinal ($T_1$) and transverse ($T_2^*$) relaxation times, flip angle inhomogeneity described by the actual-to-nominal flip angle ratio ($B_1$) and a factor proportional to the equilibrium magnetization ($\rho_0$):

$$S = \rho_0 \frac{1 - e^{-TR/T_1}}{1 - e^{-TR/T_1}\cos(B_1\alpha)} \sin(B_1\alpha) e^{-TE/T_2^*} \quad \text{(Eq. 19)}$$

This exemplary equation corresponds to Eqs. [1] and [3] above. It is noted that Eq. [1] is a general equation, Eq. [3] is the equation reduced for a two-point method, and Eq. [19] is an equation for a three-point method.

From the structure of Eq. [19], it is apparent that having three images $S_m$, m=1, 2, 3, acquired with different TR's and/or flip angles may be sufficient to estimate $T_1$. Indeed, if the three share identical bandwidth, readout, FOV and spatial resolution (to ensure identical reconstruction artifacts and $T_2^*$ weighting), then the ratio of any two images depends likely only on the unknown $T_1$ and $B_1$ in a pixel. Therefore, a pair of such ratios, say $S_1/S_3$ and $S_2/S_3$, or equivalently a pair of spherical angles $\phi = \arctan(S_3, S_1)$ and $$\theta = \arccos\left(\frac{S_2}{\sqrt{S_1^2 + S_2^2 + S_3^2}}\right)$$

are related to $T_1$ and $B_1$. Given sequence parameters, a two dimensional look-up table $T_1(\phi, \theta)$ can be generated and then polled for fast, on-line, $T_1$ extraction. The precision of the result depends on the SNR of the raw images, sequence settings ($TR_m$, $\alpha_m$, $N_m$, TE, $T_{adc}$) and on the actual values of $T_1$ and $B_1$ in that pixel.

The sequence parameter optimization may be performed with the goal of minimizing the standard deviation, $\sigma_{T_1}$, of $T_1$ estimation in the vicinity of the "expected" relaxation time $T_1^{tune}$. Since ±15% variations in $B_1$ around the "expected" $B_1^{tune} = 1.0$ are common at 3 Tesla we will minimize the "average error" at $B_1 = 0.85 B_1^{tune}$ and $B_1 = 1.15 B_1^{tune}$:

$$\overline{\sigma}_{T_1} = \sqrt{\frac{\sigma_{T_1, B_1=0.85}^2 + \sigma_{T_1, B_1=1.15}^2}{2}} \quad \text{(Eq. 20)}$$

The choice of TE and $T_{adc}$ ($T_{adc} \leq 2TE$) does not alter the spin excitation memory under investigation but affects SNR and the $T_1$ estimation precision. Generally, SNR due to $T_2^*$ decay is proportional to $\sqrt{T_{adc}} e^{-T_{adc}/2T_2^*}$. Knowing that this function attains its maximum at $T_{adc} = T_2^*$, SNR at this readout may be considered as a benchmark that is SNR at any other $T_{adc}$ may be a fraction of the maximum given by:

$$\frac{\sqrt{T_{adc}}}{\sqrt{T_2^*}} \frac{e^{-T_{adc}/2T_2^*}}{e^{-1/2}} = \sqrt{\frac{T_{adc}}{T_2^*}}\, e^{\frac{1}{2}\left(1 - \frac{T_{adc}}{T_2^*}\right)} \quad \text{(Eq. 21)}$$

The readout optimization of Eq. [21] mimicks the readout optimization of Eq. [4] of the exemplary two-point method above. Since the SNR of the raw images also depends on the RF coil, receiver hardware, spatial resolution, spin density and its $T_1$, it is convenient to introduce a benchmark that summarizes these properties and enables hardware and sample independent comparison of different sequences and protocols. One such exemplary measure that lends itself to the task is the maximum SNR attainable by running the SPGR sequence at the Ernst angle with the optimal readout in the same total imaging time as the exemplary three-SPGR method. Under these conditions the image intensity Eq. [19] is given by $$\rho_0 \sqrt{\frac{1-e^{-TR/T_1}}{1+e^{-TR/T_1}}} = \rho_0 \sqrt{\tanh(TR/2T_1)},$$

so that the SNR achieved by averaging SPGR images over time T is given by $$\frac{\rho_0}{\sigma_0} \sqrt{\frac{T}{2T_1}} \sqrt{\frac{\tanh(TR/2T_1)}{TR/2T_1}},$$

which increases monotonically as TR diminishes and approaches the maximum value of $$SNR_{\max} = \frac{\rho_0}{\sigma_0} \sqrt{\frac{T}{2T_1}} \qquad \text{(Eq. 22)}$$

where $\sigma_0$ is the standard deviation of the noise in a single image before averaging.

Using these results, $\chi^2$ fitting is executed to relate the standard deviation of $T_1$ to the three SPGR sequence parameters. Before showing this execution, it is useful to illustrate a full derivation of, $\chi^2$ fitting. In the $\chi^2$ fitting procedure, the variances of the estimated parameters are related to the variances $\sigma_m^2$ of the average images $S_m$ through the diagonal elements of the covariance matrix $C=(A^T A)^{-1}$ where m-th row of matrix A is given by:

$$A_m = \frac{1}{\sigma_m} \left( \frac{\partial S_m}{\partial \rho_0} \frac{\partial S_m}{\partial T_1} \frac{\partial S_m}{\partial B_1} \right) \qquad \text{(Eq. 23)}$$

Since in the problem considered the number of unknowns is equal to the number of images, the matrix A is square and therefore $C=A^{-1}(A^{-1})^T$. Denoting $$f_m = \frac{\partial S_m}{\partial \rho_0},$$

$$g_m = \frac{\partial S_m}{\partial T_1}$$

and $$h_m = \frac{\partial S_m}{\partial B_1},$$

the computation can be carried out to yield the diagonal element of C corresponding to the variance of $T_1$:

$$\sigma_{T_1}^2 = \frac{1}{\rho_0^2} \sum_{m=1}^{3} q_m^2 \sigma_m^2 \qquad \text{(Eq. 24)}$$

where $$q_m = \frac{\rho_0}{\det A} \det \begin{vmatrix} f_1 & \delta_{1,m} & h_1 \\ f_2 & \delta_{2,m} & h_2 \\ f_3 & \delta_{3,m} & h_3 \end{vmatrix} \qquad \text{(Eq. 25)}$$

and $\delta_{i,j}$ is the Kronecker symbol ($\delta_{i=j}=1$, $\delta_{i\neq j}=0$). The explicit expressions $f_m$, $g_m$ and $h_m$ for the SPGR sequence Eq. [19] are:

$$f_m \equiv \frac{\partial S_m}{\partial \rho_0} = \frac{1-e^{-TR_m/T_1}}{1-e^{-TR_m/T_1}\cos(B_1\alpha_m)} \sin(B_1\alpha_m) \qquad \text{(Eq. 26)}$$

$$g_m \equiv \frac{\partial S_m}{\partial T_1} = \rho_0 \frac{TR_m}{T_1^2} \frac{f_m - \sin(B_1\alpha_m)}{1-e^{-TR_m/T_1}\cos(B_1\alpha_m)}$$

$$h_m \equiv \frac{\partial S_m}{\partial B_1} = \rho_0 \frac{\alpha_m f_m}{\sin(B_1\alpha_m)} \frac{\cos(B_1\alpha_m)-e^{-TR_m/T_1}}{1-e^{-TR_m/T_1}\cos(B_1\alpha_m)}$$

If the m-th scan is averaged $N_m$ times, then $\sigma_m = \sigma_0/\sqrt{N_m}$, combining with Eq. [21] and using Eq. [22] the variance of $T_1$ becomes $$\sigma_{T_1}^2 = \frac{1}{SNR_{\max}^2} \cdot \frac{T_2^*}{T_{adc}} e^{\frac{T_{adc}}{T_2^*}-1} \cdot \frac{T}{2T_1} \sum_{m=1}^{3} \frac{q_m^2}{N_m} \qquad \text{(Eq. 27)}$$

Thus, given the set of three SPGR sequence settings ($TR_m$, $\alpha_m$, $N_m$, $T_{adc}$), the values of the partial derivatives $f_m$, $g_m$, $h_m$ may be computed using Eq. [26]. The auxiliary quantities, $q_m$, may then be evaluated using Eq. [25] and the error in $T_1$ estimate is determined via equation [27].

Returning to $\chi^2$ fitting, such fitting may be executed to relate the standard deviation of $T_1$ to the three SPGR sequence parameters, this is shown by:

$$\sigma_{T_1} = \frac{T_1}{SNR_{\max}} \cdot \sqrt{\frac{T_2^*}{T_{adc}}} e^{\frac{1}{2}\left(\frac{T_{adc}}{T_2^*}-1\right)} \cdot \sqrt{\frac{T}{2T_1} \sum_{m=1}^{3} \frac{1}{N_m} \frac{q_m^2}{T_1^2}} \qquad \text{(Eq. 28)}$$

where $q_m$'s are defined in Eq. [25] and $SNR_{max}$ is the maximal SNR Eq. [22] achievable in the time allocated:

$$T = \sum_{m=1}^{3} TR_m N_m$$

The error can comprise three factors: (i) describing hardware and sample properties, (ii) accounting for signal decay and noise due to imaging readout, and (iii) reflecting sensitivity of the sequence to $T_1$. The last two terms thus may be subject to optimization. A dimensionless normalized coefficient of variation, $\epsilon_{T_1}$, as a sample, and hardware-independent measure of the precision of $T_1$ estimation may be used:

$$\varepsilon_{T_1} = \frac{\sigma_{T_1}}{T_1} SNR_{\max} \qquad \text{(Eq. 29)}$$

where smaller $\epsilon_{T_1}$ indicates more efficient use of the imaging time for $T_1$ estimation in addition to the usual "square root of time" law contained in S N $R_{max}$ Eq. [22]. It may be appreciated that Eq. [29] is analogous to Eq. [17]. The normalized coefficient of variation corresponding to the average error to be minimized may be given by:

$$\bar{\epsilon}_{T_1} = \sqrt{\frac{\epsilon^2_{T_1,B_1=0.85} + \epsilon^2_{T_1,B_1=1.15}}{2}} \quad \text{(Eq. 30)}$$

Observing the structure of Eqs. [28, 29, 30], the derivation of the expression for $\bar{\epsilon}_{T_1}$ entails only redefinition of q's to $\bar{q}^2 = (q_{B_1=0.85}^2 + q_{B_1=1.15}^2)/2$, where $q_{B_1}$'s are the same q's defined by Eq. [25] but evaluated at the corresponding $B_1$'s.

Minimization of this metric can yield optimal acquisition parameters for $T_1$ measurement in the vicinity of the assumed values of $T_1^{tune}$ and $B_1^{tune}$. Nevertheless, once a protocol is chosen, Eqs. [28] and [29] can be used to evaluate $\epsilon_{T_1}$ for any combinations of $T_1$ and $B_1$. The map of $\epsilon_{T_1}(T_1, B_1)$ can then be examined on how the precision degrades as $T_1$ and $B_1$ deviate from their tuning values. The wider the region over which the error remains small, i.e. the flatter the map, the better. Choosing to minimize the average error at ±15% rather than that simply at $B_1^{tune}$ helps this cause.

Exemplary Pulse Sequence.

As discussed herein, the exemplary embodiment of the method and system of the present invention may be used with any suitable sequence. For example, the exemplary method may be used for $T_1$ imaging using two gradient-echo (GRE) acquisitions, $T_2$ imaging using two spin-echo acquisitions, $T_2^*$ imaging using two GRE acquisitions, apparent diffusion coefficient imaging using two diffusion-weighted acquisitions, $T_1$ imaging insensitive to $B_1$ inhomogeneities using three GRE acquisitions, $B_1$ imaging insensitive to $T_1$ using three GRE acquisitions, or others. Exemplary pulse sequences thus may comprise, for example, a spin echo sequence, a diffusion weighted sequence, a T1 weighted MRI pulse sequence, a dual echo sequence, a gradient recalled echo sequence, or a fast B1 mapping imaging sequence, or others.

Figure 3:
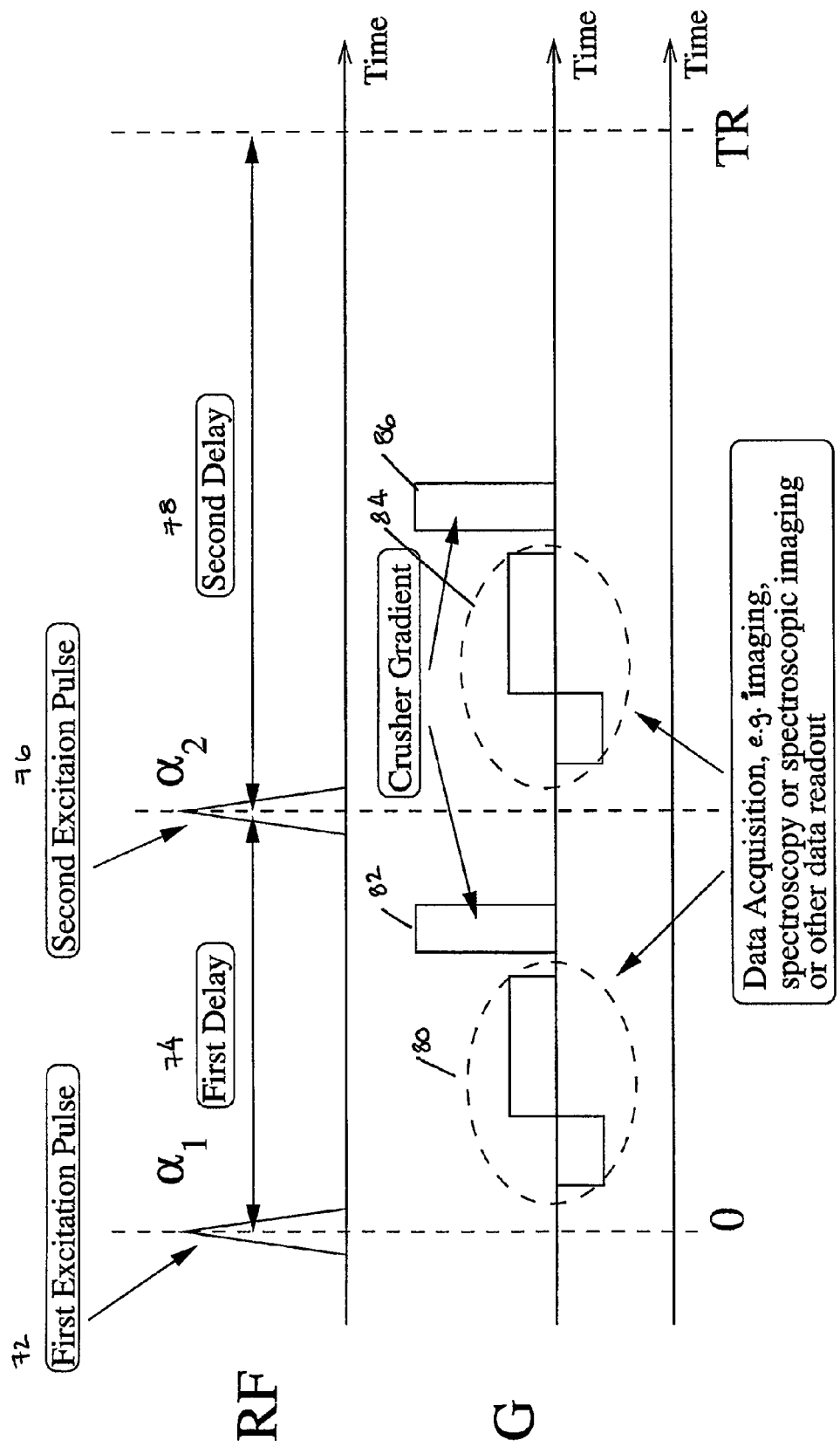
FIG. 3 is an exemplary sequence diagram which illustrates a fast $B_1$ mapping sequence in accordance with one exemplary embodiment.

In accordance with one exemplary embodiment, the method can be used with a fast $B_1$ mapping sequence. The fast B1 mapping sequence may comprise a spoiled dual-flip-angle sequence, where a second excitation of a nominal flip-angle $\alpha_2$ follows a first excitation of a flip-angle $\alpha_1$. The second excitation can be performed after a very short time delay, such that longitudinal recovery during this period can be neglected. The spins may be allowed to relax during the time $T_R$. After the time $T_R$, the cycle may be repeated. The data readouts may be performed after both excitations. An exemplary sequence diagram for a fast B1 mapping sequence is shown in FIG. 3. In the exemplary embodiment shown, the sequence may comprise a first excitation pulse 72, followed by a first delay 74, a second excitation pulse 76, and a second delay 78. A first data acquisition 80 and a first crusher gradient 82 are performed during the first delay. A second data acquisition 84 and a second crusher gradient 86 are performed during the second delay 86.

In accordance with the exemplary sequence shown in FIG. 3, the first and the second images $\rho_1$ and $\rho_2$ in the steady-state are:

$$\rho_1 = \rho_0 m(b_1 | \alpha_1, \alpha_2, T_R/T_1) \sin(b_1\alpha_1) \quad \text{[Eq. 31]}$$

$$\rho_2 = \rho_0 m(b_1 | \alpha_1, \alpha_2, T_R/T_1) \cos(b_1\alpha_1)\sin(b_1\alpha_2) \quad \text{[Eq. 32]}$$

$$m(b_1 | \alpha_1, \alpha_2, T_R/T_1) = \frac{1 - e^{-T_R/T_1}}{1 - e^{-T_R/T_1}\cos(b_1\alpha_1)\cos(b_1\alpha_2)} \quad \text{[Eq. 33]}$$

The radio-frequency field inhomogeneity $b_1$ can be found numerically using Eqs. [31] and [32] from the ratio of the observed image intensities:

$$\frac{\rho_2}{\rho_1} = \frac{\cos(b_1\alpha_1)\sin(b_1\alpha_2)}{\sin(b_1\alpha_1)} \quad \text{[Eq. 34]}$$

The formulated problem fits the developed framework of the exemplary method for determining exemplary values for acquisition parameters, and thus, the relative error on $b_1$ is:

$$\frac{\sigma_{b_1}}{b_1} = \frac{1}{b_1} \frac{\sigma_0}{\rho_0 m(b_1 | \alpha_1, \alpha_2, T_R/T_1)} \sqrt{\frac{T_R}{T}} \frac{\sqrt{f_1^2 + f_2^2}}{|f_1 g_2 - f_2 g_1|} \quad \text{[Eq. 35]}$$

$$f_1 = \sin(b_1\alpha_1), \; g_1 = \frac{df_1}{db_1} \quad \text{[Eq. 36]}$$

$$f_2 = \cos(b_1\alpha_1)\sin(b_1\alpha_2), \; g_2 = \frac{df_2}{db_1}$$

The normalized coefficient of variation is:

$$\epsilon_{b_1} = \frac{\sigma_{b_1}}{b_1} \frac{\rho_0}{\sigma_0} \sqrt{\frac{T}{T_1}} \quad \text{[Eq. 37]}$$

$$= \frac{1}{b_1 m(b_1 | \alpha_1, \alpha_2, T_R/T_1)} \sqrt{\frac{T_R}{T_1}} \frac{\sqrt{f_1^2 + f_2^2}}{|f_1 g_2 - f_2 g_1|}$$

$$\epsilon_{b_1} = \frac{1 - e^{-T_R/T_1}\cos(b_1\alpha_1)\cos(b_1\alpha_2)}{1 - e^{-T_R/T_1}} \quad \text{[Eq. 38]}$$

$$\sqrt{T_R/T_1} \frac{\sqrt{1 - \cos^2(b_1\alpha_1)\cos^2(b_1\alpha_2)}}{\left| \begin{array}{c} (b_1\alpha_2)\cos(b_1\alpha_1)\cos(b_1\alpha_2) \\ \sin(b_1\alpha_1) - (b_1\alpha_1)\sin(b_1\alpha_2) \end{array} \right|}$$

For every selected total imaging time T (in units of $T_1$), the acquisition parameters $\alpha_1$, $\alpha_2$, $T_R/T_1$ and N can minimize the $\epsilon_{b_1}$ of Eq. [37] may be determined numerically. This can specify an exemplary acquisition protocol for fast $B_1$-mapping using the proposed dual-flip-angle sequence.

Exemplary System

An exemplary embodiment of the system according to the present invention can be configured or programmed to perform the exemplary method described herein. Reference is made to FIG. 1a for a general set up for the exemplary system for magnetic resonance imaging which is so configured/programmed and may be described above. As previously discussed, an exemplary system may comprise an MRI apparatus 100 including an RF receiver 160 and an RF transmitter 150, a processor 120, and an output device 140. The exemplary MRI apparatus 100 of FIG. 1a can further include an input device 130, for example, for sending instructions to the processor 120. As discussed with reference to FIG. 1b, exemplary optimal values for acquisition parameters can be determined based on total imaging time and other restrictions. The user interface for the protocol generator, which may be provided as part of the input device 130, in accordance with certain exemplary embodiments, thus may include (a) imaging time, (b) spatial resolution of the image and field of view, (c) other limitations such as hardware, power, contrast agent dose, and (d) a priori estimations for unknown physical quantities involved. In certain exemplary embodiments, other fields or values may be provided on the user interface for the exemplary protocol generator.

The exemplary framework described herein may be programmed into any modern MRI host computer as a "push button" procedure. While exemplary embodiments are described with reference to two-point and three-point measurements, it is to be appreciated that they system and method may be used with any multi-point measurement. Given simple parameters at the imager's console at acquisition time: type of quantitative metric sought, FOV, image resolution and total time, the exemplary method may provide an optimal measurement protocol. Furthermore, given these simple inputs, the exemplary method can also estimate the precision obtainable for the sought metric a priori, guiding the user to its usefulness.

Further, a computer readable accessible medium having stored thereon computer-executable instructions for performing the exemplary embodiment of the method of magnetic resonance imaging can be provided.

EXAMPLES

The exemplary method is demonstrated for $T_1$, $T_2$, and DTI mapping using gradient echo sequence (GRE) and dual spin-echo sequence (SE) (also referred to as double fast spin echo or dual echo) imaging. Tables are provided within the example for exemplary parameters for various experimental scenarios.

All experiments were done in a 3T Siemens Trio whole body imager (Siemens AG, Erlangen, Germany) using its transmit-receive body coil, on a uniform 15 cm diameter×40 cm length cylindrical water phantom of $T_1 \cong 300$ ms, $T_2 \cong 200$ ms. To assess the variability of each of the above metrics, each experiment was repeated, four times, sequentially to yield four metric values per pixel. The standard deviation of these values was determined and its histogram over all pixels was produced. Kolmogorov Smirnov tests were used to assess the chance of obtaining the observed histograms difference accidentally.

A. Exemplary $T_1$ Estimation

The experiments used a 3D GRE with 192×192×48 mm³ FOV and 64×64×16 matrix. A comparison may be made between the Deoni et al. method (Deoni S C, Rutt B K, Peters T M. *Rapid combined T1 and T2 mapping using gradient recalled acquisition in the steady state*. Magn Reson Med 2003; 49 (3): 515-526) and the method of the example according to the exemplary embodiment of the present invention. The optimization-specific acquisition parameters, according to Deoni et al. DESPOT1 and this example are compiled in Table 1 below. Both experiments were performed back-to-back using equal measurement time.

TABLE 1

Summary of the GRE $T_1$ experimental protocol-specific acquisition parameters.

|  | DESPOT1 | | OPTIMAL | |
|---|---|---|---|---|
|  | Scan 1 | Scan 2 | Scan 1 | Scan 2 |
| $T_R$, (ms) | 15 | | 90 | 60 |
| α, (°) | 7° | 42° | 17° | 49° |
| N | 5 | | 1 | 1 |
| $T_E$, (ms) | 3.5 | | 31 | |

In two-point GRE, the image intensity, $\rho_{gre}$, is related to $T_2^*$, $\rho_0$, flip angle, α, and repetition time, $T_R$, by:

$$\rho_{gre} = \rho_0 \frac{1 - e^{-T_R/T_1}}{1 - e^{-T_R/T_1}\cos\alpha} \sin\alpha \cdot e^{-T_E/T_2^*} \quad [\text{Eq. 39}]$$
$$= \rho_0 \cdot f_{gre}(\alpha, T_R, T_E | T_1), (T_{adc} \leq 2T_E).$$

Eq. [39] can be cast in the form of Eq. [3]. Thus, the general framework presented above, can be applicable to $T_1$ estimation where information is encoded via changes in $T_R$ and/or α.

Figure 4A:
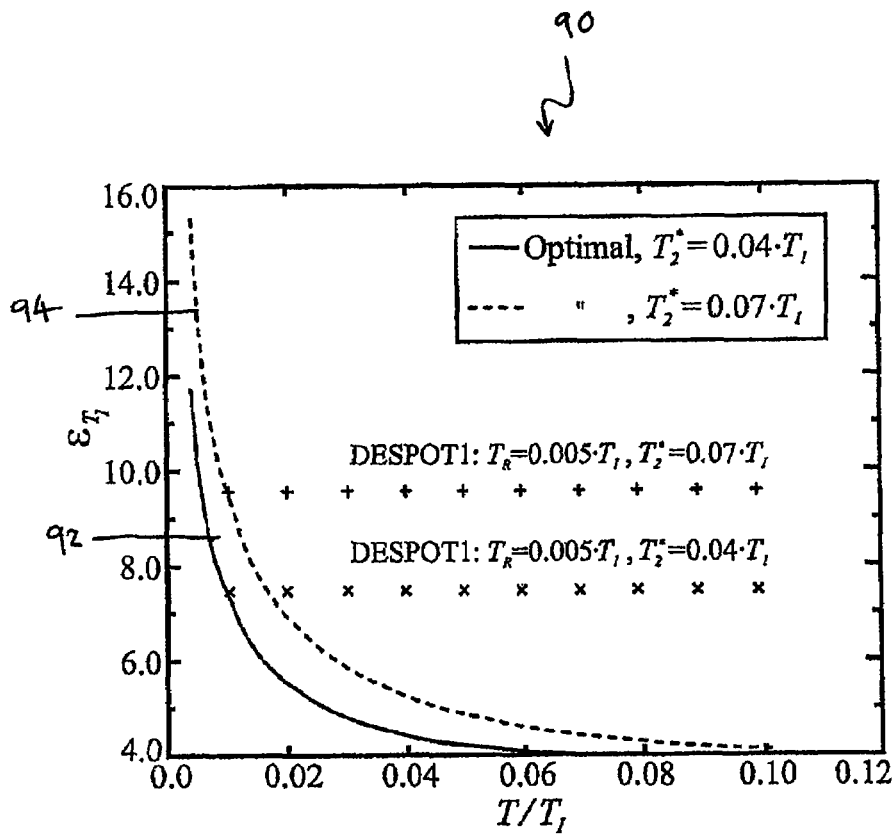
FIG. 4a is an exemplary graph illustrating exemplary results when T increases and acquisition parameters are adjusted, for $T<0.1 \cdot T_1$ and representative $T_2^*=0.04 \cdot T_1$ and $0.07 \cdot T_1$, in accordance with one embodiment.
Figure 4B:
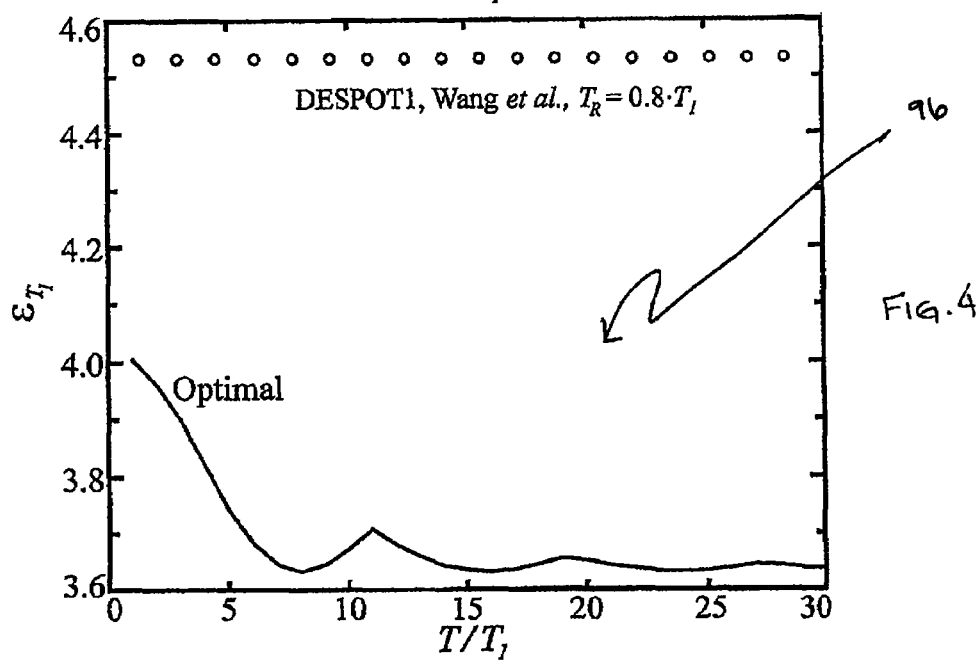
FIG. 4b is an exemplary graph illustrating exemplary results when T increases and acquisition parameters are adjusted, for $T>T_1$, a regime where $\epsilon_{T_1}$ no longer depends on $T_2^*$, in accordance with one exemplary embodiment.

To see how the normalized coefficient of variation, $\epsilon_{T_1}$, changes with T, a numerical search for acquisition parameters minimizing it, Eq. [18], was done. The results, given in Table 2 and FIGS. 4a and 4b, show that when T increases and acquisition parameters adjusted according to Table 2, a global minimum of $\epsilon_{T_1}^{min}=3.63$ is approached at the optimal parameters of Table 3. Specifically, FIGS. 4a and 4b illustrate exemplary graphs for the normalized coefficient of variation $\epsilon_{T_1}$, Eq. [17] as a function of imaging time T. FIG. 4a shows the exemplary graph 90 for $T<0.1 \cdot T_1$ and representative $T_2^*=0.04 \cdot T_1$ and $0.07 \cdot T_1$ (solid and dashed lines, 92 and 94, respectively). FIG. 4b shows the exemplary graph 96 for $T>T_1$, a regime where $\epsilon_{T_1}$ no longer depends on $T_2^*$. Because the number of averages $N_1$ and $N_2$ are integers, $\epsilon_{T_1}$ attains oscillatory behavior as a function of T. Repeating the imaging pair until all time is spent, as prescribed by Deoni et al. and Wang et al., leads to constant coefficient of variation $\epsilon_{T_1}$, s, marked by "+"s, "×"s sand "○"'s.

TABLE 2

Exemplary GRE acquisition parameters for $T_1$ measurement given total imaging time T, $T_2^* = 0.04 \cdot T_1$, as described in the $T_1$ Estimation example and the corresponding normalized coefficient of variation, $\epsilon_{T_1}$, see (FIGS. 4a and 4b).

| $T/T_1$ | $\epsilon_{T_1}$ | $T_{R,1}/T_1$ | $\alpha_1°$ | $N_1$ | $T_{R,2}/T_1$ | $\alpha_2°$ | $N_2$ |
|---|---|---|---|---|---|---|---|
| 0.005 | 10.2025 | 0.0025 | 2 | 1 | 0.0025 | 10 | 1 |
| 0.010 | 7.4188 | 0.0050 | 2 | 1 | 0.0050 | 14 | 1 |
| 0.015 | 6.1578 | 0.0075 | 3 | 1 | 0.0075 | 17 | 1 |
| 0.020 | 5.5365 | 0.0100 | 3 | 1 | 0.0100 | 20 | 1 |
| 0.025 | 5.0876 | 0.0125 | 4 | 1 | 0.0125 | 21 | 1 |
| 0.030 | 4.7815 | 0.0150 | 4 | 1 | 0.0150 | 24 | 1 |
| 0.035 | 4.5919 | 0.0175 | 4 | 1 | 0.0175 | 26 | 1 |
| 0.040 | 4.4128 | 0.0200 | 5 | 1 | 0.0200 | 27 | 1 |
| 0.045 | 4.2862 | 0.0225 | 5 | 1 | 0.0225 | 29 | 1 |
| 0.050 | 4.2036 | 0.0250 | 5 | 1 | 0.0250 | 30 | 1 |
| 0.055 | 4.1410 | 0.0275 | 6 | 1 | 0.0275 | 31 | 1 |
| 0.060 | 4.0793 | 0.0300 | 6 | 1 | 0.0300 | 33 | 1 |
| 0.065 | 4.0416 | 0.0325 | 6 | 1 | 0.0325 | 34 | 1 |
| 0.070 | 4.0228 | 0.0350 | 6 | 1 | 0.0350 | 36 | 1 |
| 0.075 | 4.0185 | 0.0375 | 7 | 1 | 0.0375 | 36 | 1 |
| 0.080 | 4.0055 | 0.0405 | 7 | 1 | 0.0395 | 37 | 1 |
| 0.085 | 4.0020 | 0.0425 | 7 | 1 | 0.0425 | 39 | 1 |
| 0.090 | 4.0023 | 0.0450 | 7 | 1 | 0.0450 | 40 | 1 |
| 0.095 | 4.0058 | 0.0470 | 7 | 1 | 0.0480 | 41 | 1 |

TABLE 2-continued

Exemplary GRE acquisition parameters for $T_1$ measurement given total imaging time T, $T_2^* = 0.04 \cdot T_1$, as described in the $T_1$ Estimation example and the corresponding normalized coefficient of variation, $\epsilon_{T_1}$, see (FIGS. 4a and 4b).

| $T/T_1$ | $\epsilon_{T_1}$ | $T_{R,1}/T_1$ | $\alpha_1°$ | $N_1$ | $T_{R,2}/T_1$ | $\alpha_2°$ | $N_2$ |
|---|---|---|---|---|---|---|---|
| 0.100 | 4.0111 | 0.0510 | 8 | 1 | 0.0490 | 41 | 1 |
| 0.150 | 4.0128 | 0.0700 | 9 | 1 | 0.0800 | 52 | 1 |
| 0.200 | 4.0053 | 0.1000 | 11 | 1 | 0.0500 | 42 | 2 |
| 0.250 | 4.0033 | 0.1300 | 12 | 1 | 0.0400 | 37 | 3 |
| 0.300 | 4.0011 | 0.1500 | 13 | 1 | 0.0500 | 42 | 3 |
| 0.400 | 4.0002 | 0.2000 | 15 | 1 | 0.0500 | 42 | 4 |
| 0.500 | 3.9991 | 0.2500 | 17 | 1 | 0.0417 | 38 | 6 |
| 0.600 | 3.9973 | 0.3000 | 18 | 1 | 0.0429 | 39 | 7 |
| 0.700 | 3.9955 | 0.3500 | 20 | 1 | 0.0437 | 39 | 8 |
| 0.800 | 3.9934 | 0.4000 | 21 | 1 | 0.0444 | 40 | 9 |
| 0.900 | 3.9912 | 0.4500 | 22 | 1 | 0.0409 | 38 | 11 |
| 1.0 | 4.0053 | 0.100 | 55 | 5 | 0.500 | 25 | 1 |
| 2.0 | 3.9612 | 0.119 | 60 | 8 | 1.050 | 35 | 1 |
| 3.0 | 3.8995 | 0.104 | 55 | 13 | 1.650 | 45 | 1 |
| 4.0 | 3.8212 | 0.103 | 55 | 18 | 2.150 | 50 | 1 |
| 5.0 | 3.7423 | 0.100 | 55 | 23 | 2.700 | 60 | 1 |
| 6.0 | 3.6813 | 0.100 | 55 | 27 | 3.300 | 70 | 1 |
| 7.0 | 3.6436 | 0.100 | 55 | 33 | 3.700 | 75 | 1 |
| 8.0 | 3.6325 | 0.100 | 55 | 39 | 4.100 | 80 | 1 |
| 9.0 | 3.6453 | 0.100 | 55 | 45 | 4.500 | 85 | 1 |
| 10.0 | 3.6730 | 0.100 | 55 | 52 | 4.800 | 85 | 1 |
| 11.0 | 3.7088 | 0.100 | 55 | 50 | 3.000 | 65 | 2 |
| 12.0 | 3.6809 | 0.100 | 55 | 55 | 3.250 | 70 | 2 |
| 13.0 | 3.6606 | 0.100 | 55 | 60 | 3.500 | 75 | 2 |
| 14.0 | 3.6436 | 0.100 | 55 | 66 | 3.700 | 75 | 2 |
| 15.0 | 3.6359 | 0.100 | 55 | 71 | 3.950 | 80 | 2 |
| 16.0 | 3.6324 | 0.100 | 55 | 77 | 4.150 | 80 | 2 |
| 17.0 | 3.6364 | 0.100 | 55 | 84 | 4.300 | 80 | 2 |
| 18.0 | 3.6453 | 0.100 | 55 | 90 | 4.500 | 85 | 2 |
| 19.0 | 3.6570 | 0.100 | 55 | 97 | 4.650 | 85 | 2 |
| 20.0 | 3.6535 | 0.100 | 55 | 92 | 3.600 | 75 | 3 |
| 21.0 | 3.6436 | 0.100 | 55 | 99 | 3.700 | 75 | 3 |
| 22.0 | 3.6384 | 0.100 | 55 | 105 | 3.833 | 75 | 3 |
| 23.0 | 3.6338 | 0.100 | 55 | 109 | 4.033 | 80 | 3 |
| 24.0 | 3.6324 | 0.100 | 55 | 116 | 4.133 | 80 | 3 |
| 25.0 | 3.6343 | 0.100 | 55 | 123 | 4.233 | 80 | 3 |
| 26.0 | 3.6391 | 0.100 | 55 | 130 | 4.333 | 80 | 3 |
| 27.0 | 3.6453 | 0.100 | 55 | 134 | 4.533 | 85 | 3 |
| 28.0 | 3.6436 | 0.100 | 55 | 132 | 3.700 | 75 | 4 |
| 29.0 | 3.6393 | 0.100 | 55 | 138 | 3.800 | 75 | 4 |
| 30.0 | 3.6359 | 0.100 | 55 | 142 | 3.950 | 80 | 4 |

TABLE 3

Exemplary sequence parameters for $T_1$ estimation using two GRE acquisitions, as described in the $T_1$ Estimation example.

| | Acquisition 1 | Acquisition 2 |
|---|---|---|
| $T_R/T_1$ | 4.1 | 0.1 |
| $\alpha$ | 80° | 55° |
| N | 1 | 38.38 |
| $T_{adc}/T_2^*$ | | 1 |
| $T_E/T_{adc}$ | | 0.5 |
| $\epsilon_{T_1}^{min}$ | | 3.63 |

The numerical search employed the brute-force algorithm on a grid in the $(T_{R,1}, T_{R,2}, \alpha_1, \alpha_2)$ space on the mesh provided in Table 4. This computation took under 10 seconds on a Pentium IV class workstation. If, instead of Eq. [15], $N_1 = N_2$ and $T_{R,1} = T_{R,2}$ restrictions are imposed, the disclosed method yields the same results reported previously by Deoni et al. and Wang et al. Deoni S C, Rutt B K, Peters T M, *Rapid combined T1 and T2 mapping using gradient recalled acquisition in the steady state*, Magn Reson Med 2003; 49 (3): 515-526; Wang H Z, Riederer S J, Lee J N, *Optimizing the precision in T1 relaxation estimation using limited flip angles*, Magn Reson Med 1987; 5 (5): 399-416, both incorporated by reference herein in their entireties.

TABLE 4

Exemplary sequence parameters for $T_1$ estimation found numerically using brute-force algorithm in this configuration with flip angles limited to less than 90°.

| Experiment duration | Minimum $T_{R,1,2}$ | Step in $T_{R,1,2}$ | Step in $\alpha_{1,2}°$ |
|---|---|---|---|
| $T \leq 0.1T_1$ | $0.0025T_1$ | $0.0025T_1$ | 1 |
| $0.1T_1 < T < 1.0T_1$ | $0.04T_1$ | $0.01T_1$ | 1 |
| $T \geq 1.0T_1$ | $0.1T_1$ | $0.05T_1$ | 5 |

The $T_1$ estimate is related to the ratio of the averaged image intensities of Eq. [39] via:

$$\frac{\rho_{gre,1}}{\rho_{gre,2}} = \frac{(1 - e^{-T_{R,1}/T_1})(1 - e^{-T_{R,2}/T_1}\cos\alpha_2)\sin\alpha_1}{(1 - e^{-T_{R,2}/T_1})(1 - e^{-T_{R,1}/T_1}\cos\alpha_1)\sin\alpha_2}. \quad [\text{Eq. 40}]$$

Although Eq. [40] has no analytic solution for arbitrary combinations of repetition times, pre-computed image-intensity ratios for the $T_1$ range of interest and chosen acquisition parameters can be stored in a look-up table. Estimates of $T_1$ can subsequently be made from that table based on the observed image-intensity ratios.

The exemplary advantages of the exemplary protocol-design according to the present invention are demonstrated for two concrete scenarios. For many cases of interest, such as brain $T_1$ mapping, where $T_1^* \sim 1000$ ms and $T_2^* \sim 40$-70 ms, the optimal $T_{adc} = T_2^*$ can be satisfied if $T_R > 100$ ms. Estimation of $T_1$ based on two GRE images using $T_{R,1} = T_{R,2} = 0.8 \cdot T_1$, $\alpha_1 = 112°$, $\alpha_2 = 29°$ and $N_1 = N_2 = 5$, yields $\epsilon_{T_1} = 4.56$. Removing the artificial $T_{R,1} = T_{R,2}$ and $N_1 = N_2$ restriction reveals that $T_{R,1} = 4.1 \cdot T_1$, $T_{R,2} = 0.1 \cdot T_1$, $N_1 = 1$ and $N_2 = 38$ yields approximately 25% less variation in $T_1$ estimate for equal time, as shown in Table 3. Higher precision achieved by this exemplary protocol can remain so between $0.01 \cdot T_1$ and $2.16 \cdot T_1$ around the assumed value of $T_1$. The bounds of this interval, defined as points of equal precision of both protocols, were found numerically using Eq. [7] and bisection method on intervals between $0.01 \cdot T_1$ and $1 \cdot T_1$ and between $1 \cdot T_1$ and $10 \cdot T_1$.

Another comparison can be made with the parameters of Deoni et al.'s DESPOT1: $T_{R,1} = T_{R,2} = 0.005 \cdot T_1$, $\alpha_1 = 3°$, $\alpha_2 = 13°$, $N_1 = N_2 = 5$. For equal $0.05 \cdot T_1$ total time, the exemplary method according to the present invention may yield: $T_{R,1} = 0.025 \cdot T_1$, $T_{R,2} = 0.025 \cdot T_1$, $\alpha_1 = 5°$, $\alpha_2 = 30°$, $N_1 = 1$, $N_2 = 1$ (see Table 2, above). Although neither protocol accommodates $T_{adc} = T_2^*$ due to the short $T_R$s, the exemplary protocol according to the present invention may facilitate fivefold longer readouts, yielding factors of 1.7-1.9 $T_1$ higher precision than DESPOT1, as shown in the exemplary graphs of FIGS. 4a and 4b. The $T_1$-interval over which the exemplary method outperforms the conventional method was found to be at least between about $0.01 \cdot T$, and $10 \cdot T_1$.

Exemplary Results

A comparison of the estimates from Deoni et al.'s DESPOT1 and a two-point $T_1$, in accordance with one exemplary embodiment of the present invention, is shown in the exemplary graph of FIG. 5. For example, FIG. 5 illustrates a graph 200 of a histogram of the distribution of experimental variability in $T_1$, $\sigma_{T_1}$, estimates using DESPOT1 (dashed curve 202) and the exemplary method according to the present invention (solid curve 204). Both experiments took equal time and their specific acquisition parameters are listed in Table 1, above. Note that (i) $\sigma_{T_1}$s produced by the exemplary method according to the present invention cluster closer to zero than DESTPOT1's, indicating that smaller errors, (higher precision) occur more often; and (ii) the precision of the exemplary method according to the present invention, a factor of 2 better than DESPOT1 (see arrow) is achieved by a rearrangement of the (same) sequence acquisition parameters.

As shown in FIG. 5, using the exemplary method according to the present invention, the standard deviations cluster closer to zero. Based on the Kolmogorov-Smirnov test, the probability that observed difference in distributions is accidental is less than about $10^{-5}$.

B. Exemplary $T_2$ Estimation

The experiments used a 2D SE sequence with 192×192×12 mm³ FOV, 64×64×4 matrix, $T_R$=1200 ms and α=90°. Optimization specific acquisition parameters are described in Haacke et al., "*Magnetic Resonance Imaging: Physical Principles and Sequence Design*," John Wiley & Sons, 1999, the entire disclaimer of which is incorporated herein by reference. The exemplary optimization specific acquisition parameters chosen according to Haacke et al. publication and this example are compiled in Table 5. Both experiments were performed sequentially using approximately equal measurement time. Thus, a comparison may be made between the Haacke et al. method and the method according to the exemplary embodiment of the present invention.

TABLE 5

Summary of the SE $T_2$ experiments protocol-specific acquisition parameters.

|  | Standard | | OPTIMAL | |
| --- | --- | --- | --- | --- |
|  | Scan 1 | Scan 2 | Scan 1 | Scan 2 |
| $T_R$, (ms) | 1200 | | | |
| α, (°) | 90° | | | |
| N | 2 | 2 | 1 | 3 |
| $T_E$, (ms) | 10 | 230 | 10 | 260 |

The SE image intensity, $\rho_{se}$, generally depends on $T_2^*$, $\rho_0$, $T_{adc}$ and echo time, $T_E$, as:

$$\rho_{se} = \rho_0 \cdot e^{-T_E/T_2} \cdot e^{-T_{adc}/2T_2^*} = \rho_0 \cdot f_{se}(T_E, T_{adc}|T_2),$$
$$(T_{adc} \leq T_E) \quad [\text{Eq. 41}]$$

which can also be cast in the form of Eq. [3] making the general framework also applicable to $T_2$ estimates encoded via changes in $T_E$ ($T_{E,1} < T_{E,2}$). Either "short echo time" $T_E \ll T_1$, or the fully relaxed $T_R \gg T_1$ cases may be considered. Eq. [41] provides that $T_{R,1} = T_{R,2}$ should be either long compared to $T_1$ or $T_{R,1} = 1 = 1.26 \cdot T_1$ if $T_{E,2}$ is much shorter than $T_1$. The former indicator is compatible with multi-slice MRI, especially at high fields where it also meets SAR limits. In such case, approximately a 90° flip angle may be selected.

To assess the dependence of the normalized coefficient of variation, $\epsilon_{T_2}$, on T, a search for the acquisition parameters minimizing it, Eq. [18], was performed numerically and the results provided in Table 6 herein. As provided in Table 6, when T increases and acquisition parameters adjusted appropriately, $\epsilon_{T_2}$ approaches its global minimum of 3.59 at $T_{E,2} \cong (T_{E,1} + 1.3 \cdot T_2)$, $N_1:N_2 \cong 5:18$ (cf Table 6). The numerical optimization employed iterative fixed point method with the initial value of $T_{E,2} - T_{E,1} = T_2$. This exemplary computation took less than a minute on a hand-held scientific calculator. If the $N_1 = N_2$ restriction can be imposed instead of Eq. [15], the exemplary method according to the present invention reproduces the same results reported previously by Haacke et al.

TABLE 6

Exemplary SE parameters for $T_2$ estimation at several acquisition durations ($N_1 + N_2$). Other exemplary acquisition parameters are $T_{adc} = T_{E,1} = T_2 \cdot T_2/(T_2^* + T_2)$, as described in $T_2$ estimation example.

| $N_1:N_2$ | $(T_{E,2} - T_{E,1})/T_2$ | $\epsilon_{T_2}$ |
| --- | --- | --- |
| 1:1 | 1.11 | 4.071 |
| 1:2 | 1.19 | 3.683 |
| 1:3 | 1.25 | 3.599 |
| 1:4 | 1.30 | 3.594 |
| 1:5 | 1.34 | 3.618 |
| 5:18 | 1.29 | 3.591 |

As provided in Table 6, the $N_1=1$, $N_2=3$ protocol, $\epsilon_{T_2}=3.599$ performs about 13% better than $N_1=N_2=2$, for which $\epsilon_{T_2}=4.071$. By analogy, the DTI estimation example, described further below, exemplary DTI acquisition parameters can be obtained with b and 1/D replacing $T_E$ and $T_2$. Exemplary $T_{adc}=T_2$, $b_1=0$ and exemplary $b_2 \cdot D$ are given in the center column.

The $T_2$ estimate can be related to the ratio of the averaged exemplary image intensities (cf Eq. [41]) as, $$T_2 = \frac{T_{E,2} - T_{E,1}}{\ln \rho_{se,1}/\rho_{se,2}} \quad [\text{Eq. 42}]$$

The effectiveness of the exemplary method according to the present invention is demonstrated by an approximately 13% variability reduction when $N_1=1$, $N_2=3$ instead of $N_1=N_2=2$, is used, as shown by Table 6, above. The $T_2$-interval over which the $N_1=1$, $N_2=3$ protocol outperforms the $N_1=N_2=2$ one was found to be between about $0.46 \cdot T_2$ and $10 \cdot T_2$. The bounds of this interval, defined as points of equal precision of both protocols, were found numerically using Eq. [7] and the bisection method on the intervals between $0.01 \cdot T_2$ and $1 \cdot T_2$ and between $1 \cdot T_2$ and $10 \cdot T_2$.

Exemplary Results

Figure 6:
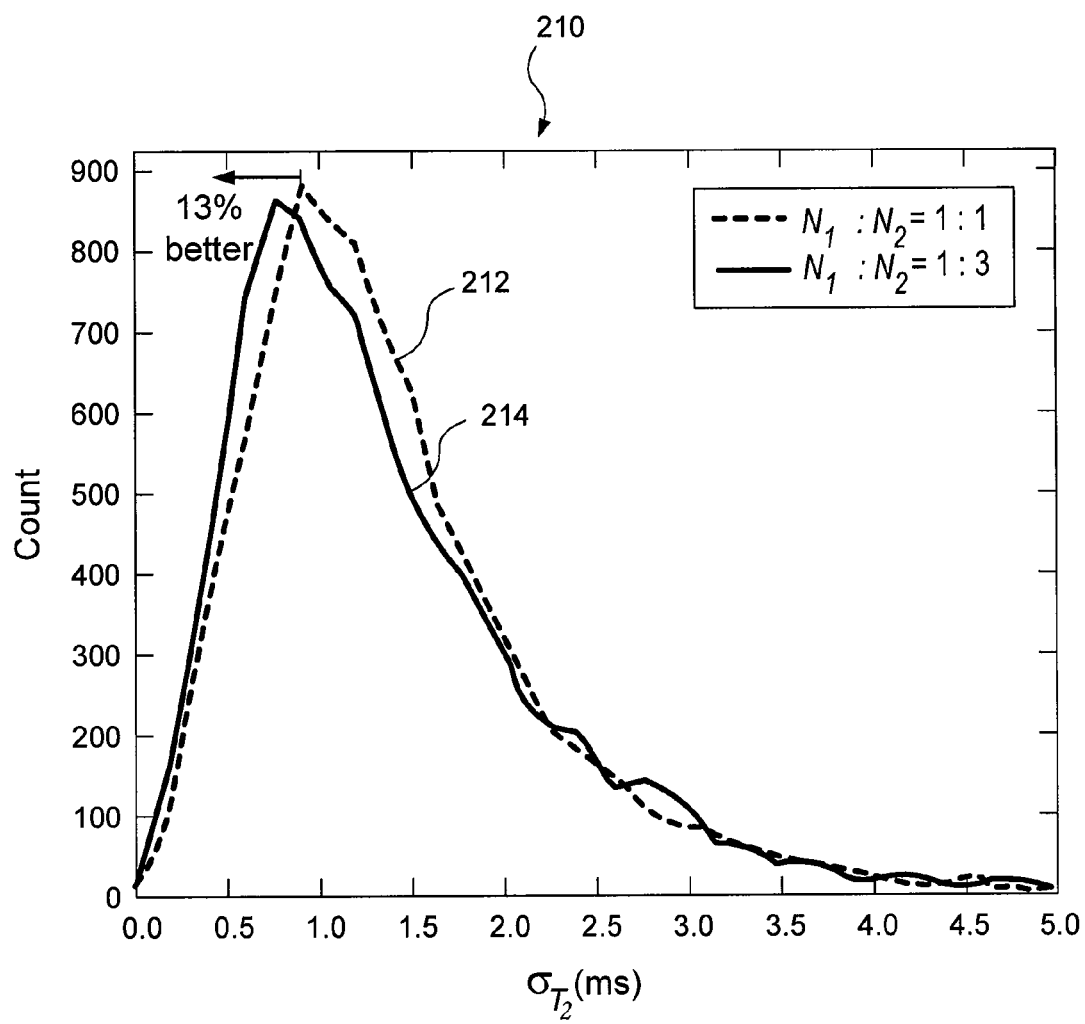
FIG. 6 is an exemplary histogram of the distribution of experimental variability in $T_2$, $\sigma_{T_2}$, estimates using the standard $N_1:N_2=1:1$ Haacke et al. protocol (dashed curve) and an $N_1:N_2=1:3$ protocol in accordance with one embodiment (solid curve)

A comparison of the standard approach, described in the Haacke et al. publication, versus the $T_2$ two-point estimates, is shown in the exemplary graph 210 of FIG. 6. For example, FIG. 6 illustrates a graph of an exemplary histogram of the distribution of experimental variability in $T_2$, $\sigma_{T_2}$, estimates using the standard $N_1:N_2=1:1$ Haacke et al. protocol (dashed curve 212), and an $N_1:N_2=1:3$ protocol in accordance with the exemplary method according to the present invention (solid curve 214). Both experiments took equal time and their specific acquisition parameters are provided in Table 5, above. Further, (i) the $\sigma_{T_2}$ produced by the exemplary method according to the present invention can cluster closer to zero than the standard's, indicating that smaller errors, i.e., higher precision occurs more often; and (ii) the theoretical 13% improvement (see arrow), is realized by a rearrangement of the sequence acquisition parameters.

As provided in Table 5, the standard deviations of the exemplary method according to the present invention can cluster closer to zero. The theoretically predicted 13% gain, shown in the graph of FIG. 6, is achieved by a re-arrangement of the acquisition parameters. The probability of obtaining this exemplary result by chance, according to the Kolmogorov-Smirnov test, is less than about $10^{-5}$.

C. Exemplary DTI Estimation

The data for the DTI optimization comparisons was taken from Xing et al., "Optimised diffusion-weighting for measurement of apparent diffusion coefficient (ADC) in human brain," Magn Reson Imaging 1997, Vol. 15(7), pp. 771-784.

An exemplary DTI intensity, $\rho_{dti}$, can be related to the diffusion tensor, D, and weighting parameter, b, by:

$$\rho_{dti} = \rho_0 \cdot e^{-bD} \cdot e^{-T_{adc}/2T_2*} = \rho_0 \cdot f_{dti}(b, T_{adc}|D) \qquad [\text{Eq. 43}]$$

which can be cast in the form of Eq. [3]. The exemplary method according to the present invention, therefore, may be applicable to D estimation when it is encoded via changes in b.

The exponential behavior of $\rho_{dti}$ can be analogous to $T_2$ weighting, Eq. [41], with b and 1/D replacing $T_E$, and $T_2$. The difference being that since $T_{adc}$ does not influence DTI sensitization, the optimal $T_{adc} = T_2*$ and $b_1 = 0$. The preferable $b_2$s for a range of imaging times are provided in Table 6, above. Indeed, the exemplary framework according to the present invention can reproduce the result reported previously in Table 1 of the Xing et al. publication and Table 6 above.

Exemplary Results

Experimental data, shown in FIG. 3 of the Xing et al. publication, confirm the expected 13% accuracy improvement in diffusion tensor estimation when using $N_1 = 1$, $N_2 = 3$ versus $N_1 = N_2 = 2$.

D. Exemplary Three SPGR Method

Minimization of the average normalized coefficient of variation was performed numerically using brute-force algorithm on a grid in the sequence-parameter space reported in Table 7. The value of $T_2*$ needed for numerical minimization since it enters Eq. [28], was chosen to be $0.05\ T_1^{tune}$ as an acceptable approximation. However, if $T_2*$ is substantially different, the minimization should be repeated. The computation took several hours on a Pentium IV class workstation and yielded the set of acquisition parameters presented in Table 8. The granularity of the search grid is dictated by the numerical complexity of the problem. It is therefore possible that the absolute minimum was not reached. It is also possible that there are several minima. However, it is not necessary to find absolutely the best protocol per se, as it is preferable to search for a protocol whose precision is close to the absolute minimum.

TABLE 7

Configuration of the brute-force search algorithm employed for sequence parameter optimization. The range of nominal flip angles was limited to (15°, 135°).

| Experiment duration | Minimum $TR_m$ | Step in $TR_m$ | Step in $\alpha_m$, (°) |
|---|---|---|---|
| $T \leq 2.0 T_1$ | $0.01 T_1$ | $0.01 T_1$ | 5 |
| $T > 2.0 T_1$ | $0.1 T_1$ | $0.1 T_1$ | 5 |

TABLE 8

Optimal SPGR sequence parameters for $T_1$ estimation for a given total imaging time T and $T_2* = 0.05\ T_1^{tune}$. The corresponding average normalized coefficient of variation $\epsilon_{T1}$ is also listed. Optimal readout duration: $T_{adc} = \min(T_2*, TR_m)$.

| $T/T_1^{tune}$ | $\epsilon_{T1}$ | $TR_1/T_1^{tune}$ | $B_1^{tune}\alpha_1$, (°) | $N_1$ | $TR_2/T_1^{tune}$ | $B_1^{tune}\alpha_2$, (°) | $N_2$ | $TR_3/T_1^{tune}$ | $B_1^{tune}\alpha_3$, (°) | $N_3$ |
|---|---|---|---|---|---|---|---|---|---|---|
| 0.1 | 20.6648 | 0.03 | 15 | 1 | 0.03 | 35 | 1 | 0.04 | 135 | 1 |
| 0.2 | 14.1786 | 0.06 | 15 | 1 | 0.05 | 40 | 1 | 0.00 | 135 | 1 |
| 0.3 | 12.3081 | 0.09 | 15 | 1 | 0.04 | 35 | 2 | 0.13 | 135 | 1 |
| 0.4 | 11.3185 | 0.11 | 15 | 1 | 0.04 | 35 | 3 | 0.17 | 135 | 1 |
| 0.5 | 10.7166 | 0.13 | 15 | 1 | 0.05 | 40 | 3 | 0.22 | 135 | 1 |
| 0.6 | 10.3048 | 0.14 | 15 | 1 | 0.05 | 40 | 4 | 0.26 | 135 | 1 |
| 0.7 | 10.0273 | 0.16 | 15 | 1 | 0.05 | 40 | 5 | 0.29 | 135 | 1 |
| 0.8 | 9.8308 | 0.17 | 15 | 1 | 0.05 | 40 | 6 | 0.33 | 135 | 1 |
| 0.9 | 9.6718 | 0.21 | 15 | 1 | 0.05 | 40 | 6 | 0.39 | 135 | 1 |
| 1.0 | 9.5240 | 0.22 | 15 | 1 | 0.05 | 40 | 7 | 0.43 | 135 | 1 |
| 1.1 | 9.3950 | 0.22 | 15 | 1 | 0.05 | 45 | 8 | 0.48 | 135 | 1 |
| 1.2 | 9.2705 | 0.23 | 15 | 1 | 0.05 | 45 | 9 | 0.52 | 135 | 1 |
| 1.3 | 9.1371 | 0.30 | 20 | 1 | 0.05 | 40 | 9 | 0.55 | 135 | 1 |
| 1.4 | 8.9933 | 0.31 | 20 | 1 | 0.05 | 40 | 10 | 0.59 | 135 | 1 |
| 1.5 | 8.8622 | 0.32 | 20 | 1 | 0.05 | 40 | 11 | 0.63 | 135 | 1 |
| 1.6 | 8.7272 | 0.33 | 20 | 1 | 0.05 | 40 | 11 | 0.72 | 135 | 1 |
| 1.7 | 8.5948 | 0.34 | 20 | 1 | 0.05 | 40 | 12 | 0.76 | 135 | 1 |
| 1.8 | 8.4580 | 0.35 | 20 | 1 | 0.05 | 40 | 12 | 0.85 | 135 | 1 |
| 1.9 | 8.3222 | 0.34 | 20 | 1 | 0.05 | 45 | 13 | 0.91 | 135 | 1 |
| 2.0 | 8.1808 | 0.36 | 20 | 1 | 0.05 | 40 | 13 | 0.99 | 135 | 1 |
| 3.0 | 6.9789 | 0.4 | 20 | 1 | 0.1 | 55 | 9 | 1.7 | 135 | 1 |
| 4.0 | 6.0072 | 0.4 | 20 | 1 | 0.1 | 50 | 11 | 2.5 | 120 | 1 |
| 5.0 | 5.3975 | 0.6 | 25 | 1 | 0.1 | 50 | 15 | 2.9 | 120 | 1 |
| 6.0 | 5.0339 | 0.9 | 30 | 1 | 0.1 | 50 | 19 | 3.2 | 125 | 1 |
| 7.0 | 4.8082 | 1.1 | 30 | 1 | 0.1 | 50 | 23 | 3.6 | 125 | 1 |
| 8.0 | 4.6607 | 1.3 | 35 | 1 | 0.1 | 50 | 28 | 3.9 | 125 | 1 |
| 9.0 | 4.5700 | 1.6 | 40 | 1 | 0.1 | 50 | 32 | 4.2 | 125 | 1 |
| 10.0 | 4.5035 | 2.2 | 50 | 1 | 0.1 | 50 | 36 | 4.2 | 130 | 1 |
| 11.0 | 4.4396 | 3.1 | 65 | 1 | 0.1 | 50 | 39 | 4.0 | 135 | 1 |
| 12.0 | 4.3789 | 3.4 | 70 | 1 | 0.1 | 50 | 44 | 4.2 | 135 | 1 |
| 13.0 | 4.3370 | 3.8 | 75 | 1 | 0.1 | 50 | 49 | 4.3 | 135 | 1 |
| 14.0 | 4.3144 | 4.0 | 75 | 1 | 0.1 | 50 | 55 | 4.5 | 135 | 1 |
| 15.0 | 4.3055 | 4.4 | 80 | 1 | 0.1 | 50 | 60 | 4.6 | 135 | 1 |
| 16.0 | 4.3095 | 4.5 | 80 | 1 | 0.1 | 50 | 66 | 4.9 | 135 | 1 |
| 17.0 | 4.3248 | 4.7 | 80 | 1 | 0.1 | 50 | 74 | 4.9 | 135 | 1 |
| 18.0 | 4.3514 | 4.9 | 80 | 1 | 0.1 | 50 | 82 | 4.9 | 135 | 1 |
| 19.0 | 4.3835 | 4.9 | 80 | 1 | 0.1 | 50 | 92 | 4.9 | 135 | 1 |
| 20.0 | 4.4134 | 3.9 | 85 | 2 | 0.1 | 45 | 74 | 4.8 | 135 | 1 |

The experiments were done in a 3 T Trio whole body imager (Siemens AG, Erlangen, Germany) using its transmit-receive head coil, on a uniform 15 cm diameter×40 cm length cylindrical water phantom and then in the brain of a volunteer. The volunteer was briefed on the procedure and gave institutional review board-approved written consent. Conventional 3D EPI data was acquired with 192×192×96 mm³ field of view and 64×64×32 matrix on a phantom and with 224×224×64 mm³ field of view and 224×224×64 matrix on a human head. As an example, we chose a $T=10T_1^{tune}$ protocol from Table 2 (underlined) and acquired data assuming $T_1^{tune}=300$ ms in the phantom and $T_1^{tune}=1000$ ms in vivo. In order to satisfy the shortest TR, as indicated in Table 2, 32 k-space lines were acquired after each excitation in the phantom experiment and 64 on the volunteer. The corresponding TEs were 13 and 45 ms. After on-line image reconstruction, the three image values in each pixel were converted into the spherical angles that were used to look up the values of $T_1$ and $B_1$ from the precomputed tables. The look-up table approach replaces computationally expensive non-linear % fitting but is equivalent to it since the number of unknowns is equal to the number of images. Additional advantage of the approach is that the table can be generated during data acquisition while data is still unavailable dramatically reducing the postprocessing time.

The look-up table is a 300×3000 array in the ($\phi$, $\theta$) plane. Each of its cells of is filled with the average value of $T_1$ whose underlying spherical angles fall within it. Entries into the cells are generated by computing the corresponding SPGR intensity triplet using Eq. [19] and then spherical angles for each combination of $T_1/T_1^{tune} \epsilon (0.4, 6.0)$, $B_1/B_1^{tune} \epsilon (0.7, 1.4)$ in steps of 0.001. The cells where the maximum and the minimum entries differ by more than $0.005 T_1^{tune}$ were marked as bad with a NAN (not-a-number). The table thus filled represents a single valued function $T_1$ ($\phi$, $\theta$). In other words, for any measured intensity triplet, the spherical angles are computed and then the corresponding $T_1$ is unambiguously looked-up in the table (or NAN is assigned). The look up table $B_1$ ($\phi$, $\theta$) was generated in a similar fashion.

After $T_1$ and $B_1$ in each pixel are determined, the $T_2^*$- and receive-$B_1$-weighted spin density, $\rho_0$, is extracted from Eq. [19]. Since the receive/transmit coil was used, following the reciprocity principle the $B_1$-corrected $T_2^*$-weighted spin density is obtained by dividing the extracted value by the corresponding $B_1$ in that pixel.

To illustrate the influence of the $B_1$ inhomogeneity on $T_1$ estimation phantom data was acquired using optimal two-point 3D EPI of the same total imaging time and tuning ($T=10T_1^{tune}$, $T_{tune}=300$ ms). The protocol was: $TR_1=30$ ms, $\alpha_1=55°$, $N_1=55$, $TR_2=1440$ ms, $\alpha_2=85°$, $N_2=1$ with 32 k-space lines acquired after each excitation. This data was processed as described in L. Fleysher, R. Fleysher, S. Liu, W. Zaaraoui, O. Gonen, *Optimizing the precision-per-unit-time of quantitative MR metrics: Examples for $T_1$, $T_2$ and DTI*, Magn. Reson. Med. 57 (2007) 380-387, herein incorporated by reference in its entirety.

Exemplary Results

Figure 7:
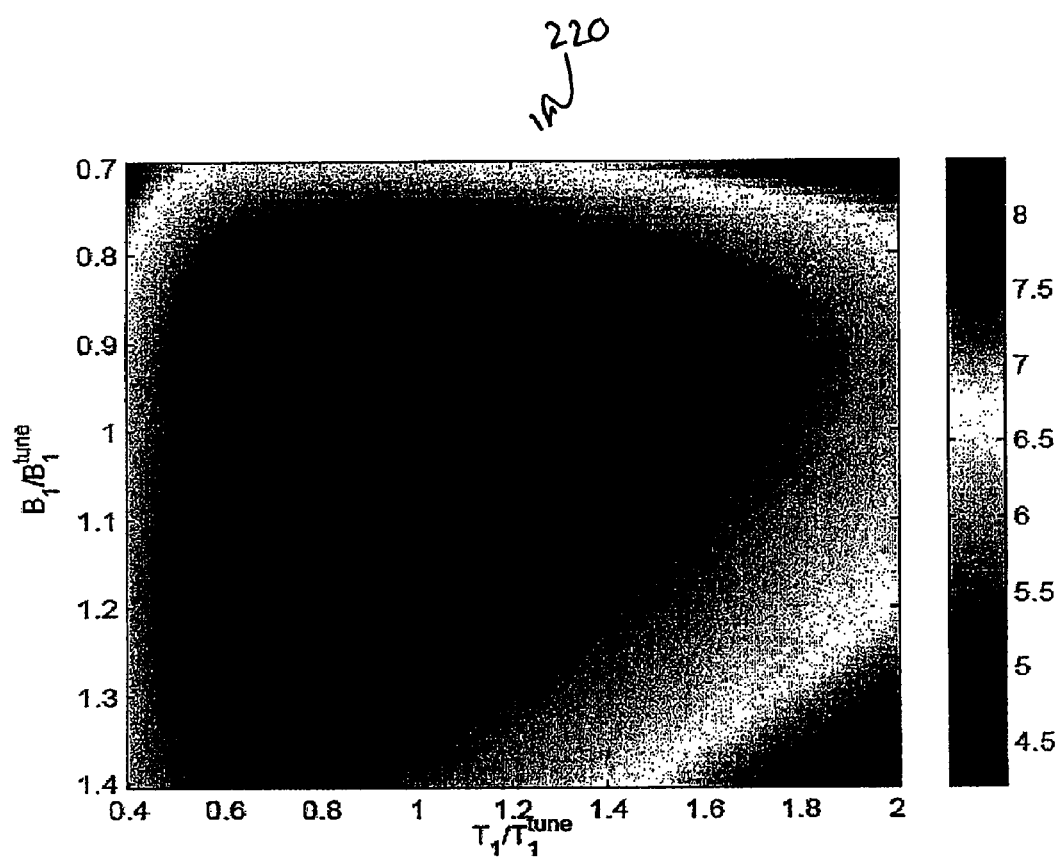
FIG. 7 is a greyscale map showing expected performance of T1 estimation using selected protocol in accordance with an exemplary embodiment of a three-point method.

The theoretically expected performance of the T1 estimation using selected protocol is demonstrated in FIG. 7 where a greyscale map 220 of normalized coefficient of variation, $\epsilon_{T1}$, is presented. More specifically, FIG. 7 illustrates the normalized coefficient of variation, $\bar{\epsilon}_{T1}$, Eq. [29] as a function of the true values of $T_1$ and $B_1$ for a protocol from Table 8 with $T=10T_1^{tune}$. The minimal error is $\epsilon_{T1}^{min}=4.2$. The surface of this plot is flat for a wide range of T1's and B1's, that is the precision remains within 20% of the minimum in the large, egg-shaped area ($0.55<T_1/T_1^{tune}<1.6$, $0.8<B_1/B_1^{tune}<1.3$).

Figure 8:
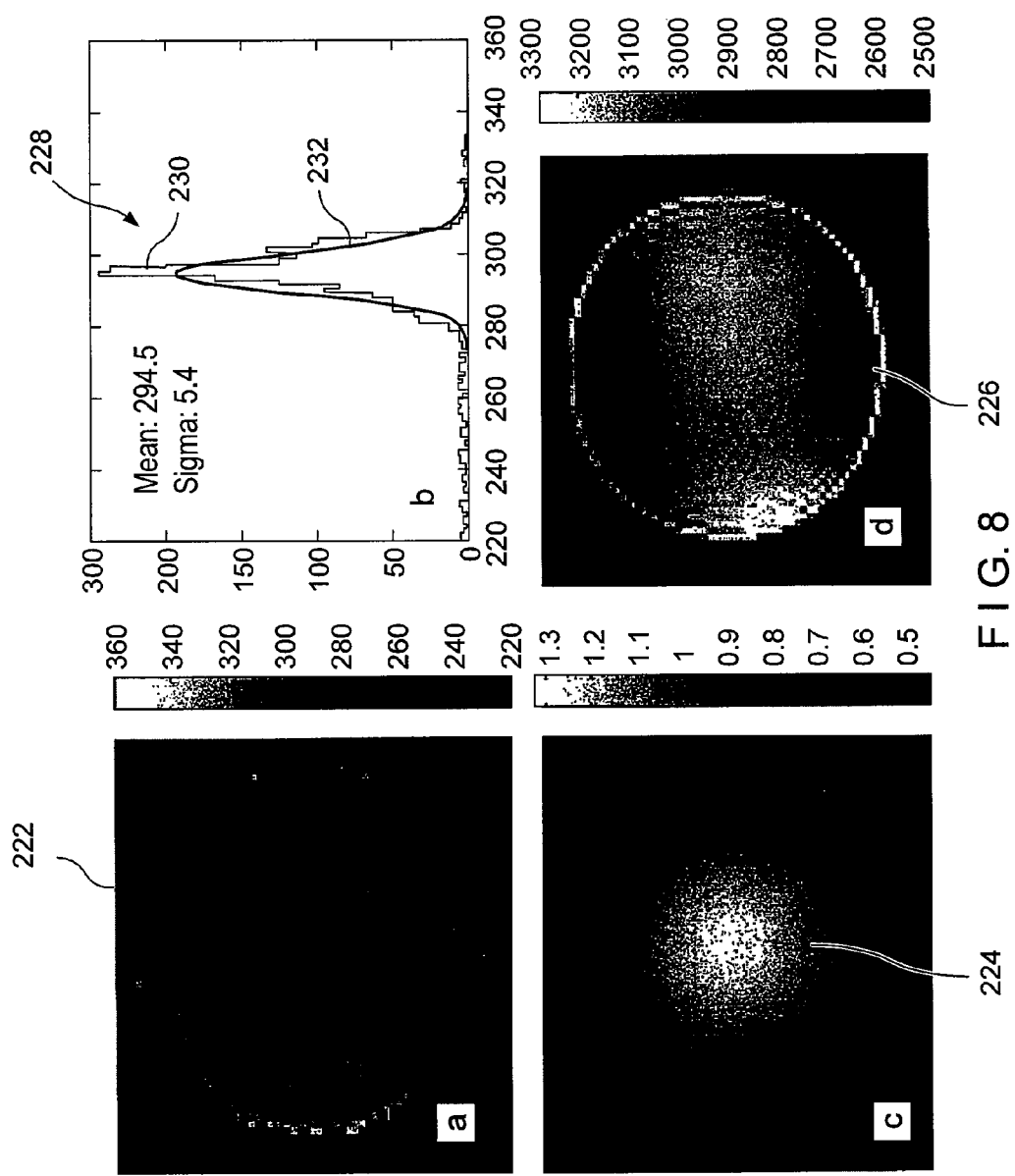
FIG. 8a is a greyscale T1 map at a slice near the center of the excited volume in accordance with one exemplary embodiment.
FIG. 8b is a histrogram of the T1 values (jagged line) overlaid with a fitted Gaussian in accordance with one exemplary embodiment.
FIG. 8c is a greyscale map of B1 in accordance with one exemplary embodiment.
FIG. 8d is greyscale B1-corrected $T_2$*-weighted spin density in accordance with one exemplary embodiment.

FIGS. 8a, 8c, and 8d illustrate greyscale T1, B1 and $T_2^*$-weighted spin-density maps 222, 224, and 226, respectively, acquired using the exemplary three-point method. FIG. 8b illustrates a histogram 228 of the $T_1$ values (agged line 230) overlaid with a fitted Gaussian (solid line 232). A histogram 228 of the T1's, the width of which can be used to gauge the precision, is shown in FIG. 8b. It is assumed that the width is due to noise alone (ignoring contributions due to possible remaining B1 inhomogeneity), the precision is rather remarkable, 1.8%. Since the phantom is uniform the $T_1$ map should be as well. To this end, the histogram features a narrow peak at 294.5±5.4 ms. Specifically, FIG. 8a illustrates an axial $T_1$ map 222 in a cylindrical phantom acquired at 3×3×3 mm₃ resolution. A T1 map at a slice near the center of the excited volume is shown. FIG. 8c illustrates a map 224 of $B_1$ showing that at the center region the flip angle is higher while towards the rim it is lower than nominal by up to 20%. The B1 map 224 in FIG. 8c demonstrates a large flip angle non-uniformity that if left uncorrected would lead to considerable systematic errors in T1 estimation (see below). Since a receive-transmit coil was used, the reciprocity principle was utilized to correct for its receive profile and obtain a $T_2^*$-weighted spin density map (panel d). FIG. 8d illustrates $B_1$-corrected $T_2^*$-weighted spin density 226 (in arbitrary units) obtained using the reciprocity principle for the receive-transmit coil.

Figure 9:
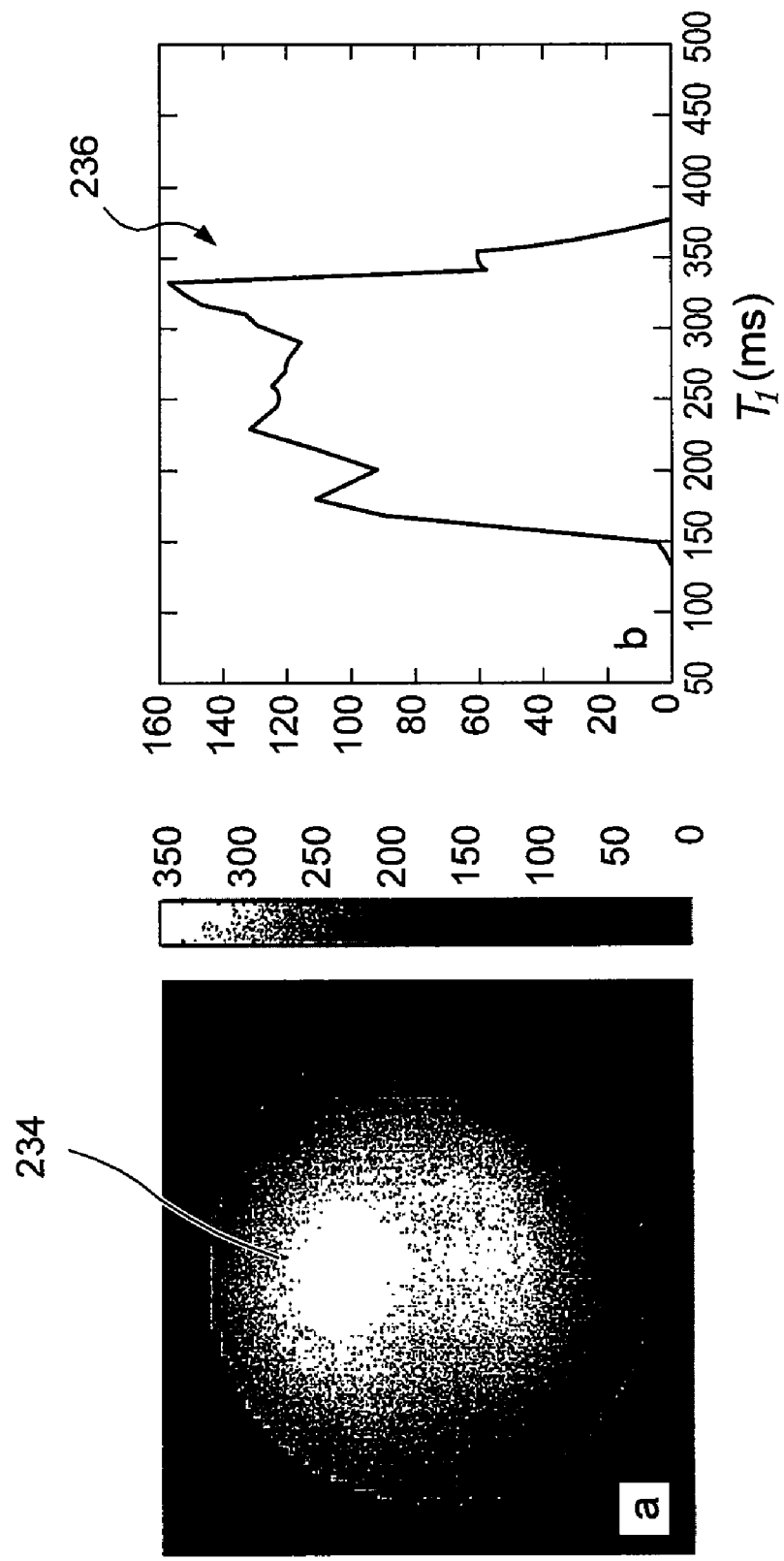
FIG. 9a is a greyscale T1 map acquired with the nearest equivalent optimal 2-point method (with the same tuning and acquisition time) in accordance with one embodiment.
FIG. 9b is a histogram acquired with the nearest equivalent optimal 2-point method (with the same tuning and acquisition time) in accordance with one embodiment.

FIGS. 9a and 9b illustrate a greyscale T1 map 234 and histogram 236, respectively, acquired with the nearest equivalent optimal 2-point method (with the same tuning and acquisition time). Specifically, FIG. 9a illustrates an axial $T_1$ map 234 in the same cylindrical phantom acquired using two-SPGR acquisition (without $B_1$ correction). FIG. 9b illustrates a histogram 236 of the $T_1$ values. Note that since the phantom is uniform the non-uniformity of the $T_1$ map and the width of the histogram are due to uncorrected $B_1$ inhomogeneity. It is evident from the map (see FIG. 9a) and the histogram (see FIG. 9b) that uncorrected B1 inhomogeneity is responsible for very large variation of T1's that is absent in FIG. 8b.

Figure 10:
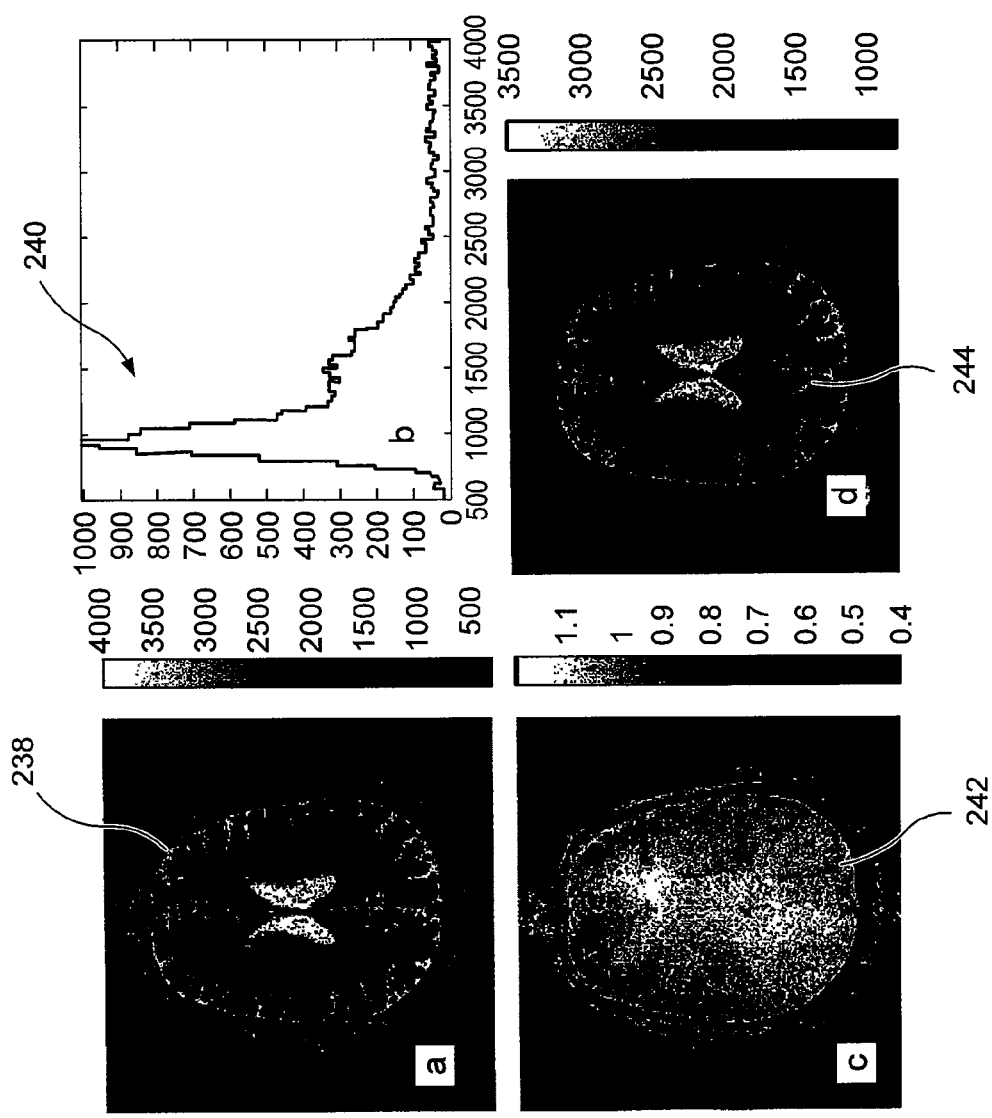

FIGS. 10a and 10b illustrate a greyscale in vivo map 238 and histogram 240 of T1 values, respectively. FIG. 10c illustrates a greyscale in vivo map 242 of B1 values. FIG. 10d illustrates a greyscale receive-coil-profile corrected $T_2^*$-weighted spin density image 244. Specifically, FIG. 10a illustrates sn in vivo 1×1×1 mm3 resolution map 238 of T1. The histogram 240 of the T1 values, shown in FIG. 10b, exhibits a narrow peak at 950 ms, a broad peak at about 1550 ms and a tail at longer T1s. These features can be ascribed to the white matter, gray matter and CSF, respectively. FIG. 10c illustrates a map 242 of $B_1$ showing that at the center region the flip angle is higher while towards the rim it is lower than nominal by about 15%. Although the in vivo B1 map 242, shown in FIG. 10c, demonstrates less non-uniformity compared to the phantom, it is still substantial. Left uncorrected, it would result in large systematic errors in the T1 map. FIG. 10d illustrates $B_1$-corrected $T_2^*$-weighted spin density 244 (in arbitrary units) obtained using the reciprocity principle for the receive-transmit coil. The effects of residual B0 inhomogeneity that were not compensated by shimming are not apparent but can not be excluded. In each of FIGS. 10a-10d, black speckles represent pixels where the signals could not be described by Eq. [19] presumably due to intravoxel variations of $T_1$ or motion.

CONCLUSION

It is recognized that the acquisition sequence parameters play an important role in the precision of quantitative imaging. Previously available MRI techniques assume that if several identical measurements are made, the derived metrics' precision improves in proportion to the square root of the time. In one exemplary embodiment according to the present invention, the exemplary method and system described herein can use the two-point method, and vary most or all acquisition parameters such that the total duration may establish the preferable protocol and, as duration increases, the precision of the derived metrics can be made to improve faster than the square root of time.

The exemplary embodiment of the method described herein, e.g., a generalized optimization framework, can be applied to any problem that can be cast into the form of, e.g., Eqs. [1] and [3]. For the purposes of illustration, two-point $T_1$, $T_2$ and DTI estimation are shown in examples herein. These examples are intended to be illustrative only. While full error-propagation with the most commonly applied restrictions, $T_{R,1}=T_{R,2}$ and $N_1=N_2$, reproduces the previous result, their removal can lead to 13-90% improvements in metric's precision, as shown in the graphs of FIG. 5 and FIG. 6.

The exemplary embodiment of the system and method addresses SNR with respect to random noise. Slow (compared to the time-scale of a single acquisition) system instabilities, such as field drifts, patient motion and sequence/hardware imperfections such as incomplete spoiling, eddy currents, etc, however, may also affect a measurement quality, and can be addressed by improved hardware and sequence design, e.g., use of navigators for field tracking, and/or corrections in post processing. The timescale on which such drifts can still be ignored, may serve as an additional guideline for the total imaging time constraint in Eq. [8]. Indeed, the flexibility of the exemplary framework can facilitate the incorporation of any constraint on the acquisition parameters, e.g., the specific absorption rate limit can also be incorporated into the design of an optimal protocol at high-fields, i.e., during the minimization of Eq. [16].

Fast efficient high resolution $T_1$ mapping techniques rely on precise knowledge of flip angles for accurate determination of the relaxation rate. Unfortunately, at higher magnetic fields the notion of flip angle is poorly defined due to non-uniform transmit coil profiles, wave effects, etc., degrading the accuracy of many quantitative techniques. The exemplary three-point method addresses the issue of $B_1$ inhomogeneity by collecting three conventional 3D SPGR EPI images to produce both unbiased and precise $T_1$ maps. The post processing step, although computationally somewhat more involved than in the two-point methods, is still straightforward and can be incorporated into on-line reconstruction.

Potential applications for the embodiments of the system and method according to the present invention can include medical applications such as clinical imaging, $B_0$ mapping, magnetic field correlation mapping, Kurtosis mapping, microvessel density mapping, diffusion tensor imaging (including D-parallel and D-perpendicular) mechanical properties of tissue (MR elastography), and perfusion imaging. The system and method may further be used for non-medical applications such as search for mineral resources including crude oil. The disclosures of every publication and/or article reference above is incorporated herein by reference in their entirety.

What is claimed is:

1. A method for generating data associated with at least one portion of a target comprising:
    forwarding at least one first excitation pulse to the target;
    acquiring a first signal from the target resulting from the at least one first excitation pulse using a plurality of acquisition parameters having first values;
    forwarding at least one second excitation pulse to the target;
    acquiring a second signal from the target resulting from the at least one second excitation pulse using a plurality of acquisition parameters having second values, wherein at least two of the first values are different from the second values;
    generating the data based on the first and second signals; and
    determining the first values and second values for the acquisition parameters based on a restriction, wherein the determination of the first values and the second values is performed by:
    selecting a type of sequence,
    identifying unknown physical quantities,
    determining a relationship between the sequence, data from the first acquired signal, data from the second acquired signal, the unknown physical quantities, and the acquisition parameters,
    defining cost function using the determined relationship, the cost function being a function of the acquisition parameters, the restriction, and the unknown physical quantities, and
    determining values for the acquisition parameters by minimizing the cost function.

2. The method of claim 1, wherein the acquisition parameters are at least one of a repetition time, a echo time, flip angle, a number of averages, a diffusion a weighting, a contrast agent dose or a receiver bandwidth.

3. The method of claim 1, wherein the first excitation pulse and the second excitation pulse are forwarded according to a magnetic resonance imaging pulse sequence.

4. The method of claim 1, wherein the first excitation pulse and the second excitation pulse are forwarded according to a nuclear magnetic resonance pulse sequence.

5. The method of claim 1, wherein the restriction is one of total imaging time, hardware restriction, or SAR limit.

6. The method of claim 1, wherein the target is an anatomical structure.

7. The method of claim 1, wherein the data acquisition is a magnetic resonance readout.

8. The method of claim 1, wherein the data is image data, and wherein the image data is generated based on the first and second signals.

9. The method of claim 1, further comprising forwarding at least one third excitation pulse to the target, acquiring a third signal from the target resulting from the at least one third excitation pulse using a plurality of acquisition parameters having third values, wherein at least two of the third values are different form the first values and the second values, and wherein the data is generated based on the third signal.

10. A computer accessible medium having stored thereon computer executable instructions for generating data associated with at least a portion of a target which, when the executable instruction are executed by a processing arrangement, configure the processing arrangement to perform a procedures comprising:
    forwarding at least one first excitation pulse to the target;
    acquiring a first signal from the target resulting from the at least one first excitation pulse using a plurality of acquisition parameters having first values;
    forwarding at least one second excitation pulse to the target;
    acquiring a second signal from the target resulting from the at least one second excitation pulse using a plurality of acquisition parameters having second values, wherein at least two of the first values are different from the second values;

generating the data based on the first and second signals; and determining the first values and the second values for the acquisition parameters based on a restriction, wherein the determination of the first values and the second values is performed by:

selecting a type of sequence, identifying unknown physical quantities, determining a relationship between the sequence, data from the first acquired signal, data from the second acquired signal, the unknown physical quantities, and the acquisition parameters, defining cost function using the determined relationship, the cost function being a function of the acquisition parameters, the restriction, and the unknown physical quantities, and determining values for the acquisition parameters by minimizing the cost function.

11. The computer accessible medium of claim 10, wherein the acquisition parameters are at least one of a repetition time, a echo time, flip angle, a number of averages, a diffusion a weighting, a contrast agent dose or a receiver bandwidth.

12. The computer accessible medium of claim 10, wherein the first excitation pulse and the second excitation pulse are forwarded according to a magnetic resonance imaging pulse sequence.

13. The computer accessible medium of claim 10, wherein the first excitation pulse and the second excitation pulse are forwarded according to a nuclear magnetic resonance pulse sequence.

14. The computer accessible medium of claim 10, wherein the restriction is one of total imaging time, hardware restriction, or SAR limit.

15. The computer accessible medium of claim 10, wherein the data is image data, and wherein the image data is generated based on the first and second signals.

16. The computer accessible medium of claim 10, wherein the procedures executed by the processing arrangement further comprise forwarding at least one third excitation pulse to the target, acquiring a third signal from the target resulting from the at least one third excitation pulse using a plurality of acquisition parameters having third values, wherein at least two of the third values are different form the first values and the second values, and wherein generating data further comprises generating data based on the third signal.

17. A system for generating data associated with at least a portion of a target, comprising:

a processor that, when executed, is configured to:

forward at least one first excitation pulse to the target;

acquire a first signal from the target resulting from the at least one first excitation pulse using a plurality of acquisition parameters having first values;

forward at least one second excitation pulse to the target;

acquire a second signal from the target resulting from the at least one second excitation pulse using a plurality of acquisition parameters having second values, wherein at least two of the first values are different from the second values;

generate the data based on the first and second signals; and determine the first values and the second values for the acquisition parameters based on a restriction, wherein the determination of the first values and the second values is performed by:

selecting a type of sequence, identifying unknown physical quantities, determining a relationship between the sequence, data from the first acquired signal, data from the second acquired signal, the unknown physical quantities, and the acquisition parameters, defining cost function using the determined relationship, the cost function being a function of the acquisition parameters, the restriction, and the unknown physical quantities, and determining values for the acquisition parameters by minimizing the cost function.

18. The system of claim 17, wherein the acquisition parameters are at least one of a repetition time, a echo time, flip angle, a number of averages, a diffusion a weighting, a contrast agent dose or a receiver bandwidth.

19. The system of claim 17, wherein the first excitation pulse and the second excitation pulse are forwarded according to a magnetic resonance imaging pulse sequence.

20. The system of claim 17, wherein the first excitation pulse and the second excitation pulse are forwarded according to a nuclear magnetic resonance pulse sequence.

21. The system of claim 17, wherein the restriction is one of total imaging time, hardware restriction, or SAR limit.

22. The system of claim 17, wherein the data is image data, and wherein the image data is generated based on the first and second signals.

23. The system of claim 17, wherein, when executed, the processor is further configured to forward at least one third excitation pulse to the target, acquire a third signal from the target resulting from the at least one third excitation pulse using a plurality of acquisition parameters having third values, wherein at least two of the third values are different form the first values and the second values, and wherein, when executed, the processor is further configured to generate data based on the third signal.

* * * * *